(12) United States Patent
Akaishi

(10) Patent No.: US 7,679,097 B2
(45) Date of Patent: Mar. 16, 2010

(54) SEMICONDUCTOR LIGHT EMITTING DEVICE AND METHOD FOR MANUFACTURING THE SAME

(75) Inventor: Kazuyuki Akaishi, Anan (JP)

(73) Assignee: Nichia Corporation, Anan-Shi (JP)

( * ) Notice: Subject to any disclaimer, the term of this patent is extended or adjusted under 35 U.S.C. 154(b) by 79 days.

(21) Appl. No.: 11/253,748

(22) Filed: Oct. 20, 2005

(65) Prior Publication Data

US 2006/0124954 A1   Jun. 15, 2006

(30) Foreign Application Priority Data

Oct. 21, 2004   (JP)   ............... P 2004-306501

(51) Int. Cl.
*H01L 33/00*   (2006.01)
(52) U.S. Cl. ............... 257/99; 257/79; 257/88; 257/89; 257/90; 257/91; 257/92; 257/93; 257/94; 257/E33.056; 257/E33.057; 257/E33.058
(58) Field of Classification Search ............... 257/79, 257/88, 89, 90–94, 99, E33.056–E33.058
See application file for complete search history.

(56) References Cited

U.S. PATENT DOCUMENTS

| | | | |
|---|---|---|---|
| 6,455,878 B1 * | 9/2002 | Bhat et al. | ............... 257/99 |
| 6,462,358 B1 | 10/2002 | Lin et al. | |
| 2001/0032985 A1 * | 10/2001 | Bhat et al. | ............... 257/88 |
| 2003/0141506 A1 | 7/2003 | Sano et al. | |
| 2003/0209720 A1 * | 11/2003 | Okazaki et al. | ............... 257/98 |
| 2004/0072383 A1 | 4/2004 | Nagahama et al. | |
| 2004/0129944 A1 * | 7/2004 | Chen | ............... 257/89 |
| 2005/0133806 A1 * | 6/2005 | Peng et al. | ............... 257/99 |

FOREIGN PATENT DOCUMENTS

| | | |
|---|---|---|
| JP | 05-037087 | 2/1993 |
| JP | 11-150297 | 6/1999 |
| JP | 2000-091628 | 3/2000 |
| JP | 2001-223386 A | 8/2001 |
| JP | 2001-339100 | 12/2001 |
| JP | 2003-31858 A | 1/2003 |
| JP | 2003-086836 | 3/2003 |
| JP | 2004-056109 | 2/2004 |

* cited by examiner

*Primary Examiner*—Kiesha R Bryant
*Assistant Examiner*—Minchul Yang
(74) *Attorney, Agent, or Firm*—Birch, Stewart, Kolasch & Birch, LLP

(57) ABSTRACT

A semiconductor light emitting device having a semiconductor stacking structure bonded onto the support member and having excellent characteristics is provided by a preferable electrode structure.

The semiconductor light emitting device comprising; a semiconductor stacking structure having a first semiconductor layer and a second semiconductor layer of conductivity types different from each other, a first electrode connected to the first semiconductor layer, and a second electrode connected to the second semiconductor layer, wherein one principal surface of the first electrode has a portion that makes contact with the first semiconductor layer so as to establish electrical continuity and an external connection section.

15 Claims, 13 Drawing Sheets

SEMICONDUCTOR LIGHT EMITTING DEVICE AND METHOD FOR MANUFACTURING THE SAME

TECHNICAL FIELD

The present invention relates a semiconductor light emitting device that has semiconductor stacking structure and, more particularly, to a semiconductor light emitting device that is bonded onto a support member, and a method for manufacturing the same.

BACKGROUND ART

A light emitting device based on a semiconductor is made by stacking semiconductor layers such as n-type and/or p-type so as to form a semiconductor stacking structure on a substrate and providing electrodes on the layers of different conductivity types, while electricity is supplied through the electrodes so that the device emits light. There is also such a light emitting device comprising a support member and a semiconductor stacking structure made by bonding a semiconductor device structure formed on a substrate onto the support member (for example, shown in FIG. 2 of Japanese Unexamined Patent Publication (Kokai) No. 2003-31858).

However, the structure of the light emitting device of the prior art does not allow it to extract sufficient light, and the electrodes of the light emitting device bonded onto the support member cannot be formed so as have sufficient characteristics suitable for a light emitting device due to constraints of the manufacturing process.

Specifically, in the semiconductor stacking structure that is bonded onto the support member, the electrodes provided on the semiconductor stacking structure before bonding can be alloyed by heat treatment or the like after forming the electrodes, so that the properties of the electrodes such as ohmic property, heat resistance, reliability during the operation of the light emitting device, for example heat resistance of the device and bonding property can be improved. However, the electrodes provided on the semiconductor stacking structure after bonding it onto the support member can not be sufficiently heat treated due to restriction resulted from heat resistance of the bonding member. For example, in case denaturing or deformation of the bonding member through heat treatment causes a decrease in the bonding strength, it is necessary to set a lower heat treatment temperature so as to avoid such troubles. As a result, it has been difficult to obtain satisfactory characteristics of the electrodes that are provided on the semiconductor stacking structure after bonding it onto the support member.

There is also such a problem that the structure and the arrangement of the electrodes in the semiconductor stacking structure are such that shade the emitted light depending on the material of the electrodes, and therefore the electrode structure involves advanced design. In case the semiconductor layers of different types of conductivity have different levels of carrier mobility, layout of the electrodes formed on the semiconductor layers different types of conductivity has a great influence on the control of carrier, consequently on the efficiency of light emission. For example, when the surface area of the light emitting device becomes larger, a part of the light emitting structure section may not emit sufficient amount of light due to the structure of the electrode even when the light emitting structure section has a surface area that is proportional to the surface area of the device. Moreover, the light emitting structure section may instead absorb the light propagating in the light emitting device thus making it impossible to increase the optical output in proportion to the increase in the device area. When the area of light emitting devices, area of the light emitting structure and the number of light emitting structure sections are increased, there arise such problems as the uniformity of light emission and loss of light in a portion having low efficiency of light emission. Therefore, design of the structures of the electrodes and the device are very important.

In case the electrode is used for dissipating heat, it must be designed by giving consideration also to the layout of the lead-out portion of the electrode for external connection and the route of dissipating heat from the semiconductor stacking structure. Thus extremely sophisticated design is required to provide the optimum semiconductor stacking structure and electrode structure.

The semiconductor stacking structure bonded onto the support member also has the following problem. When electrodes of the light emitting device are provided between the support member and the semiconductor stacking structure, strength of bonding with the bonding member or with an insulating film that isolates the electrode of the semiconductor stacking structure and the bonding member, layout of these members within a plane and the stacking structure have importance, and it is necessary to give consideration to the heat treatment of the electrodes and heat resistance of the bonding member in the manufacturing process. Also with regard to the stability of the members used in the light emitting device under the influence of the heat generated during operation of the device, design of the route of dissipating heat from the semiconductor stacking structure to the support member is important for ensuring sufficient reliability in terms of bonding strength and the like.

DISCLOSURE OF THE INVENTION

The present invention aims at solving the problems described above, and has an object of providing a preferable electrode structure of a semiconductor light emitting device comprising the semiconductor stacking structure bonded onto the support member, and providing a semiconductor light emitting device having excellent characteristics.

Specifically, the semiconductor light emitting device according to the present invention solves the various problems described above by bringing a part of one principal surface of the electrode provided on the semiconductor stacking structure into electrical continuity with the semiconductor staking structure, and exposing the other portion for the external connection.

The semiconductor light emitting device of the present invention has the semiconductor stacking structure that includes a first semiconductor layer and a second semiconductor layer of conductivity types different from each other, wherein a first electrode is connected to the first semiconductor layer and a second electrode is connected to the second semiconductor layer, while the first electrode has a portion that makes contact with the first semiconductor layer so as to establish electrical continuity and an external connection section provided on one principal surface.

In the semiconductor light emitting device of the present invention constituted as described above, the electrodes provided on the semiconductor layers that constitute the semiconductor stacking structure have semiconductor contact section which makes contact with the semiconductor stacking structure and performs a predetermined function and the external connection section which is connected to an external power source or the like, both provided on the same surface, and achieves the following effects.

The constitution described above increases the degree of freedom in the design of electrode layout. Also reliability of the electrodes can be improved since the external connection section can be exposed after forming the electrodes on the semiconductor stacking structure and applying heat treatment to the electrodes.

As the electrode has a semiconductor contact section that makes contact with an electrode forming section of the semiconductor stacking structure in one portion thereof and the external connection section in the other portion of one principal surface of the electrode, it becomes unnecessary to provide complicated interconnect electrodes for connecting the semiconductor contact section and the external connection section with each other, so that man-hours required to form the electrodes can be reduced and, since the electrode structure is simplified, the electrodes have higher reliability. Also because the external connection section is formed during the semiconductor manufacturing process, it can be formed with a very high precision with minimum surface area.

In the semiconductor light emitting device of the present invention, a pad electrode can be provided on the external connection section for the connection with external wiring members. This enables it to use a material that satisfactorily bonds with the external wiring with high bonding strength as the pad electrode, and therefore highly reliable connection with the external wiring can be established.

In case the semiconductor stacking structure of the present invention includes the first semiconductor layer of the first conductivity type and the second semiconductor layer of the second conductivity type, with the first electrode being formed on the first semiconductor layer and the second electrode formed on the second semiconductor layer, then both the first electrode and the second electrode may be formed to have the semiconductor contact section and the external connection section provided on the same surface, or only the first electrode may be formed to have the semiconductor contact section and the external connection section on the same surface with the second electrode being formed in a different constitution.

In other words, such a constitution may be employed as only the first electrode is formed to have the semiconductor contact section and the external connection section provided on the same surface while the second electrode makes contact, on one of the principal surfaces thereof, with the second semiconductor layer to establish electrical continuity therewith, with the other principal surface of the second electrode being used as the external connection section of the second electrode.

When the second electrode is formed in such a constitution as one of the principal surfaces is used as a semiconductor contact section in one portion thereof and as the external connection section in the other portion similarly to the first electrode, the first electrode and the second electrode can be provided so that the external connection section of the first electrode and the external connection section of the second electrode are disposed in the same direction, thereby enabling it, for example, to connect in the same direction by wire bonding or the like (refer to, for example, FIG. 9).

This makes it possible to achieve an advantageous arrangement bounded by an electrode structure layer where the first electrode and the second electrode are formed, in which the support member is arranged on the component mounting side of one side of the electrode structure layer and the light emitting section provided with the semiconductor stacking structure is arranged on the other side.

In case the second electrode is formed so that one of the principal surfaces thereof becomes the semiconductor contact section and the other principal surface becomes the external connection section, unlike the first electrode, for example, the external connection section of the second electrode can be connected so as to oppose the mounting substrate and the external connection section of the first electrode can be connected on the opposite side when mounting the semiconductor light emitting device, and wiring can be made in a 3-dimensional configuration that allows mounting with higher density (refer to, for example, FIG. 8). Such a device structure can also be made that light emission and heat dissipation can be efficiently controlled.

Also in case the first and second electrode forming surfaces of the device structure are disposed to oppose each other so that the first and second electrodes are formed to sandwich the device structure, the external connection sections of the first and second electrode can be disposed on the same side of the light emitting device, the light emitting device can have the external wirings provided on the same side and the second electrode can have the external connection section of the top surface of the electrode disposed within the semiconductor stacking structure, and therefore a structure of the light emitting device that is advantageous for high mounting density and smaller area can be achieved.

In the case of such an electrode structure as the first electrode and the second electrode are formed on the same surface (on the side of the electrode forming surface) of the semiconductor stacking structure while the first electrode has the semiconductor contact section and the external connection section provided on one of the principal surfaces and the second electrode has the semiconductor contact section on one of the principal surfaces and the external connection section provided on the other principal surface, on the other hand, since the surface of the semiconductor stacking structure other than the electrode forming surface can be left without being covered by the electrode, light emitted by the semiconductor stacking structure can be extracted from the surface of the semiconductor stacking structure other than the electrode forming surface without being shaded by the electrode.

In the light emitting device of the present invention having such as structure as the semiconductor stacking structure is bonded onto the support member as described above, light can be extracted efficiently from the exposed surface of the semiconductor stacking structure other than the bonding surface by disposing the first electrode and the second electrode between the support member and the semiconductor stacking structure as described above.

In case of such an device structure as the semiconductor stacking structure has a plurality of divided electrode segments, electrically conductive members that connect the electrode segments can be provided between the support member and the semiconductor stacking structure. This makes it possible to employ a variety of semiconductor stacking structures and, since the electrode structure that has the semiconductor contact section and the external connection section provided on the same surface allows a high degree of freedom in the design, electrically conductive members for connecting the electrode segments can be easily provided on the semiconductor stacking structure and on the support member. Specifically, in case the first electrode and the second electrode that has the electrode segments are provided on the semiconductor stacking structure, such a constitution may be employed as an insulating film is provided between the first and second electrodes, and the electrically conductive member that connects the electrode segments with each other is formed on the bonding side of the support member in a region larger than the forming surface of the entire electrode segments of the semiconductor stacking structure. Moreover, efficiency of the device structure can be improved further by having the bonding member that bonds the support member and the semiconductor stacking structure serve also as the electrically conductive member that connects the electrode segments with each other.

The present invention also provides a method for manufacturing the light emitting device that solves the problems of the device manufacturing method of the prior art. Specifically, after forming the electrodes to be connected to the semiconductor stacking structure on one surface of the semiconductor stacking structure, a part of the semiconductor stacking structure is removed until a part of the electrode formed on the semiconductor stacking structure is exposed, thereby to use the exposed electrode surface as the electrode for external connection.

Specifically, after forming the semiconductor stacking structure from semiconductor, the electrodes are formed on the electrode forming surface of the semiconductor stacking structure, and then a part of the semiconductor stacking structure is removed in order to expose the surface of the electrode formed on the semiconductor stacking structure for the external connection, thereby making the light emitting device. The problems of the prior art are solved by this method.

With the prior art, it is necessary to form a relatively large interconnect electrode for external connection by giving consideration to the accuracy of alignment during bonding since the electrode for external connection is provided as the interconnect electrode on the support member side. According to the manufacturing method of the present invention, in contrast, the electrode for external connection is formed first in the semiconductor stacking structure by the semiconductor processing technology, and therefore the external connection section and the semiconductor contact section can be disposed in the correct positional relationship without relation to accuracy of alignment during bonding. As a result, since the external connection section can be provided with far higher accuracy than in the prior art, the device structure of higher accuracy and higher density and device mounting with higher density are made possible.

Also because the electrodes are formed on the semiconductor stacking structure before bonding onto the support member, heat treatment can be applied to the electrodes that have been formed without being restricted by the heat resistance of the bonding member used in the bonding process. Other processes of heat treatment of the device such as decreasing the resistance of p-type nitride semiconductor by annealing or turning the semiconductor into p-type can be carried out without being restricted by the heat resistance of the bonding member used in the bonding process. Various processes can be carried out before bonding in this way because, even when the first and second electrodes are provided beforehand in the semiconductor stacking structure, at least one of the electrodes can be connected by means of the external connection section that is provided in the semiconductor processing carried out after bonding onto the support member, and it can undergo manufacturing processes similar to those of the light emitting device that is not bonded onto the support member.

In case a semiconductor growing substrate that allows easy processing such as etching, for example a semiconductor substrate such as GaN substrate, is used, the semiconductor growing substrate can also be removed as well when removing a part of the semiconductor during the process of exposing the electrode. Meanwhile the semiconductor growing substrate may be made of a material that is difficult to etch such as sapphire. In this case, it is preferable to remove the semiconductor growing substrate of the semiconductor stacking structure while having the semiconductor stacking structure bonded onto the support member in the manufacturing method of the present invention.

In case the semiconductor layer is removed in the process of exposing the electrode described above for manufacturing by using a wafer that has a plurality of device regions as shown in FIG. 13, it can be separated into device structure sections 13 that become the device regions as shown in FIG. 13E.

In the method of manufacturing the light emitting device according to the prevent invention, it is also made possible to provide a pad electrode suited to the external wiring to the external connection section of the electrode that is provided after the processing of the device such as electrode exposure process.

Further in the light emitting device of the present invention, the process of bonding the support member can be carried out after forming the insulating film that isolates between the electrodes and forming the member for bonding with the support member on the semiconductor stacking structure as described above, thereby enabling it to form the members accurately. Also because the insulating film has been formed, the bonding member can be provided so as to overlap the two electrode forming surfaces of the device structure, for example to cover substantially the entire surface of the device structure, thereby improving the bonding with the support member.

EFFECT OF THE INVENTION

The present invention utilizes a part of the electrode provided on the semiconductor stacking structure as the electrode for external connection, thereby to achieve a device structure that has high density electrode structure, and various electrode structures and semiconductor stacking structures that can be formed with high accuracy so as to provide various light emitting devices in accordance to the application.

In the case of the light emitting device comprising the semiconductor stacking structure bonded onto the support member, the first and second electrodes of the semiconductor stacking structure can be disposed with high density and high accuracy on the bonding surface, and the light emitting device having high bonding accuracy can be manufactured, thus achieving a high yield of production even for the light emitting device of complicated structure.

BEST MODE FOR CARRYING OUT THE INVENTION

Figure 1:
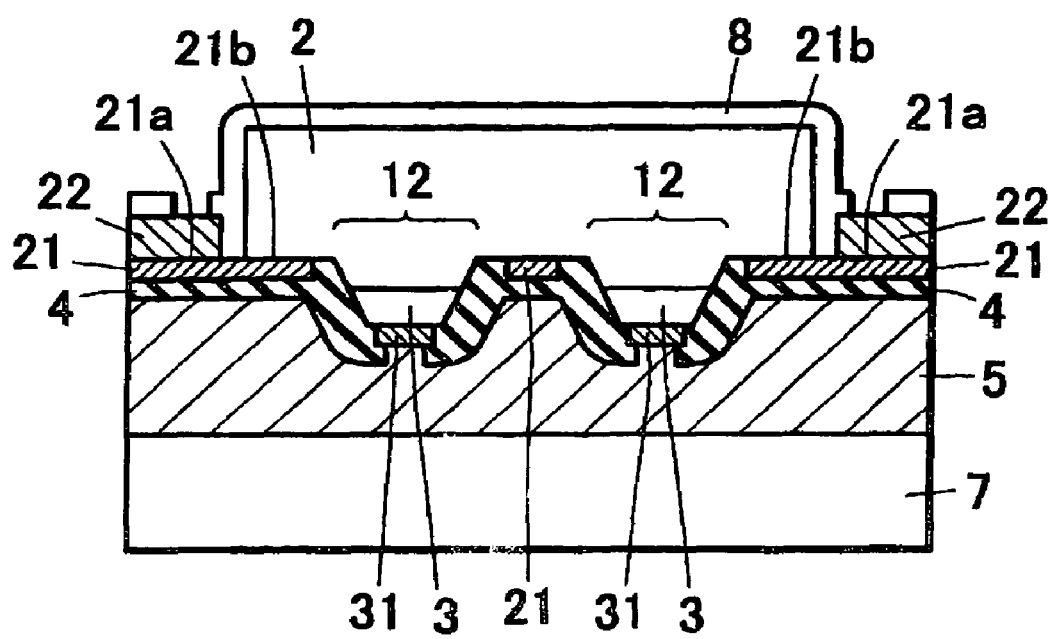
FIG. 1 is a schematic sectional view of a light emitting device according to one embodiment of the present invention.

Now the light emitting device of the present invention will be described below showing the constitution and components of the present invention by way of embodiments and Examples. It is understood that the present invention is not limited by the Examples and embodiments described later. Constitutions described in some of Examples and embodiments can be employed in other Examples and embodiments. Some of drawings referred to in some of Examples and embodiments are partially exaggerated for better understanding.

(Semiconductor Stacking Structure)

The semiconductor stacking structure of the present invention can be constituted by forming layers of predetermined conductivity types from desired semiconductor materials on a semiconductor growing substrate 1 whereon semiconductors are to be grown.

The semiconductor stacking structure of the present invention may be formed from, for example, a nitride semiconductor material. While there is no limitation to the nitride semiconductor material, GaN, AlN, InN, or a mixture of these in the form of III-V group nitride semiconductor ($In_\alpha Al_\beta Ga_{1-\alpha-\beta}N$, $0 \leq \alpha$, $0 \leq \beta$, $\alpha+\beta \leq 1$) may be used. In addition to these, a mixed crystal may be used where B or the like is used as part or all of the group III elements or a part of N included as a group V element is substituted by P, As, Sb or the like.

GaAs-based material such as AlGaAs and InGaAs, InP-based material such as AlGaInP and other III-V group compounds semiconductors such as InGaAsP that is a mixed crystal of the materials described above may be used as other examples of semiconductor materials that can be used in the light emitting device of the present invention. Nitride semiconductors are used in the Examples and embodiments of the present invention, although the present invention is not limited to these constitutions.

The semiconductor stacking structure can be made by growing n-type and p-type layers such as nitride semiconductor on a substrate by using a vapor phase growing apparatus such as MOVPE (metal organic vapor phase epitaxy), HDVPE (halide vapor phase epitaxy), MBE (molecular beam vapor phase epitaxy) or MOMBE (metal organic molecular beam vapor phase epitaxy). The semiconductor stacking structure can be formed by employing such various materials and growing methods.

Specifically, the semiconductor stacking structure may be formed, for example, by stacking, on a semiconductor growing substrate such as sapphire substrate:

a low temperature-grown buffer layer of non-dope-GaN to a thickness of 20 nm, a first underlying layer of non-dope-GaN to a thickness of 5 μm, composition and concentration gradient layer of AlGaN used as a second underlying layer to a thickness of 0.4 μm with Al moler fraction graded from 0 to 0.07 and Si concentration graded from 0 to $1 \times 10^{19}/cm^3$, so as to constitute a underlying layer of the device structure from these layers;

an n-type layer formed by stacking a first n-type layer of n-type $Al_{0.07}Ga_{0.93}N$ doped with Si with a concentration of $1 \times 10^{19}/cm^3$ to a thickness of 1.7 μm and a second n-type layer of n-type $Al_{0.07}Ga_{0.93}N$ doped with Si with a concentration of $2 \times 10^{17}/cm^3$ to a thickness of 0.8 μm;

an active layer formed by stacking barrier layers (B) of $Al_{0.09}Ga_{0.91}N$ doped with Si with a concentration of $1\times10^{19}/cm^3$ having thickness of 20 nm and well layers (W) of non-dope-$In_{0.01}Ga_{0.99}N$ having thickness of 15 nm in the order of B/W/B/W/B/W/B/W/B; and a p-type layer formed by stacking a first p-type layer (p-type cladding layer) of $Al_{0.38}Ga_{0.62}N$ doped with Mg with a concentration of $1\times10^{20}/cm^3$ to a thickness of 20 nm, a second p-type layer of $Al_{0.07}Ga_{0.93}N$ doped with Mg with a concentration of $4\times10^{18}/cm^3$ to a thickness of 0.1 μm, and a third p-type layer (p-type contact layer) of $Al_{0.07}Ga_{0.93}N$ doped with Mg with a concentration of $1\times10^{20}/cm^3$ to a thickness of 0.02 μm.

The semiconductor stacking structure described above is a device structure formed for the purpose of making a UV light emitting device to be bonded onto a support member, where the underlying layer is removed together with the semiconductor growing substrate after being bonded.

Figure 2:
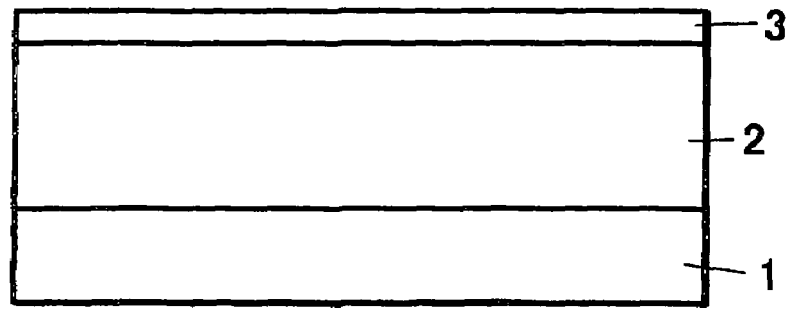
FIG. 2A is a schematic sectional view (1) explanatory of the process of manufacturing the light emitting device shown in FIG. 1.
FIG. 2B is a schematic sectional view (2) explanatory of the process of manufacturing the light emitting device shown in FIG. 1.
FIG. 2C is a schematic sectional view (3) explanatory of the process of manufacturing the light emitting device shown in FIG. 1.
FIG. 2D is a schematic sectional view (4) explanatory of the process of manufacturing the light emitting device shown in FIG. 1.
FIG. 2E is a schematic sectional view (5) explanatory of the process of manufacturing the light emitting device shown in FIG. 1.
FIG. 2F is a schematic sectional view (6) explanatory of the process of manufacturing the light emitting device shown in FIG. 1.
FIG. 2G is a schematic sectional view (7) explanatory of the process of manufacturing the light emitting device shown in FIG. 1.
Figure 2:
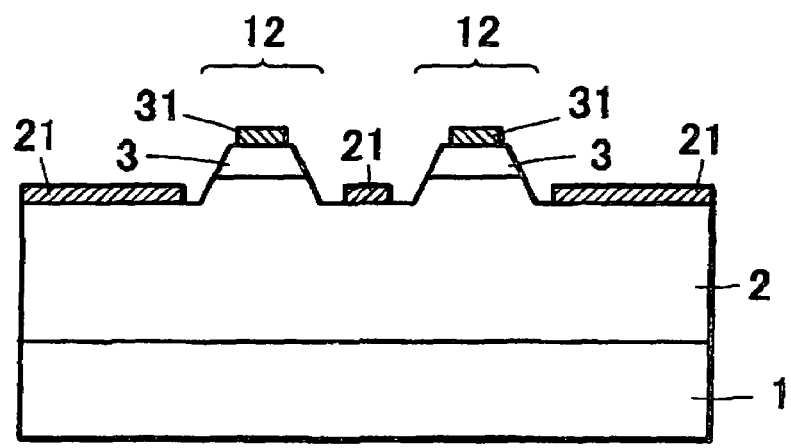
Figure 2:
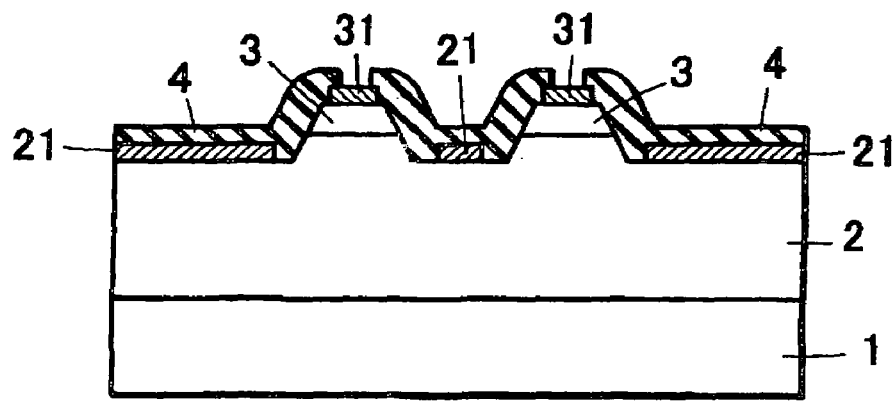
Figure 2:
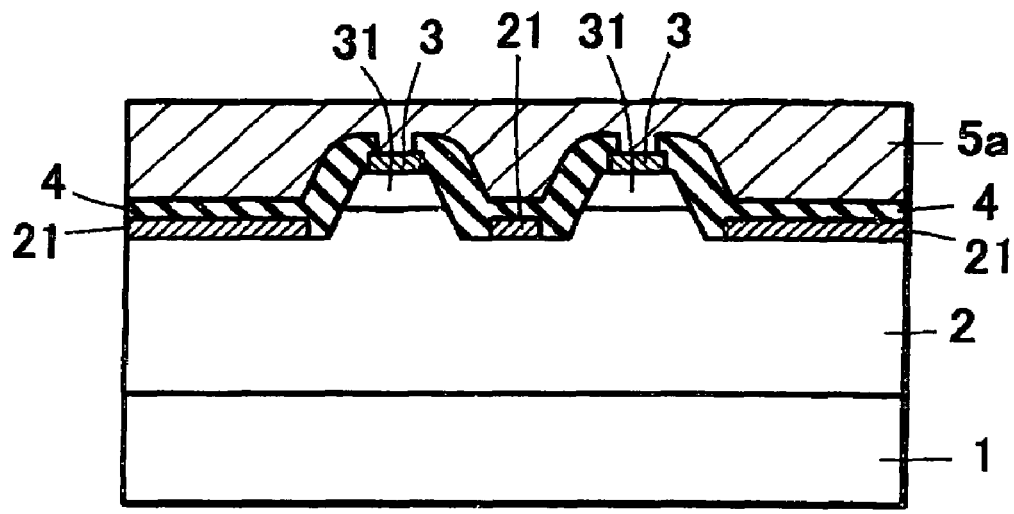
Figure 2:
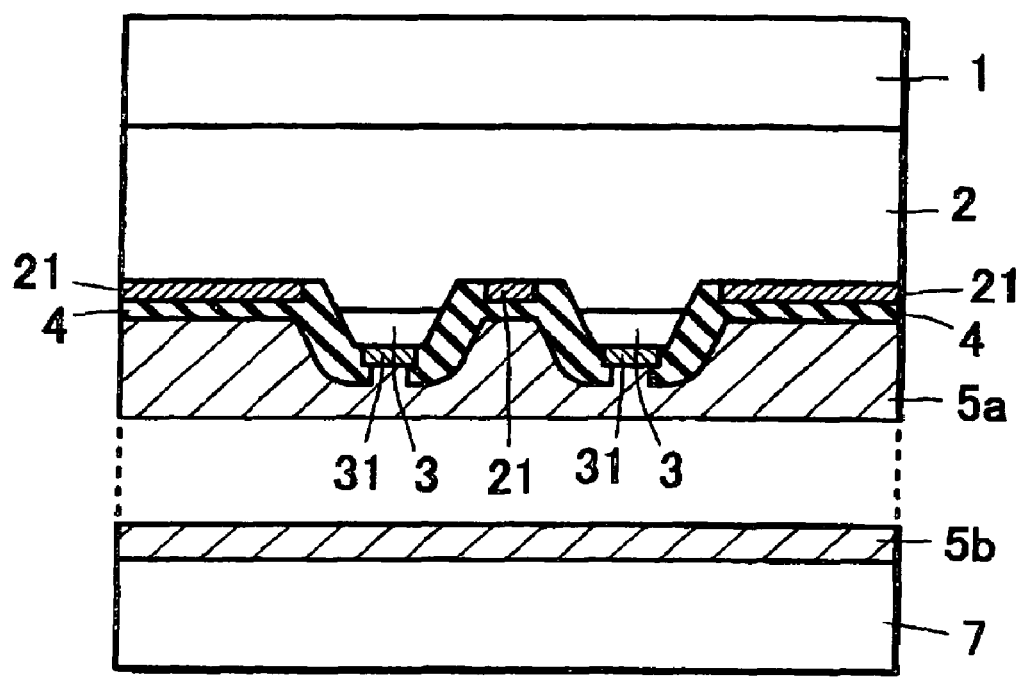
Figure 2:
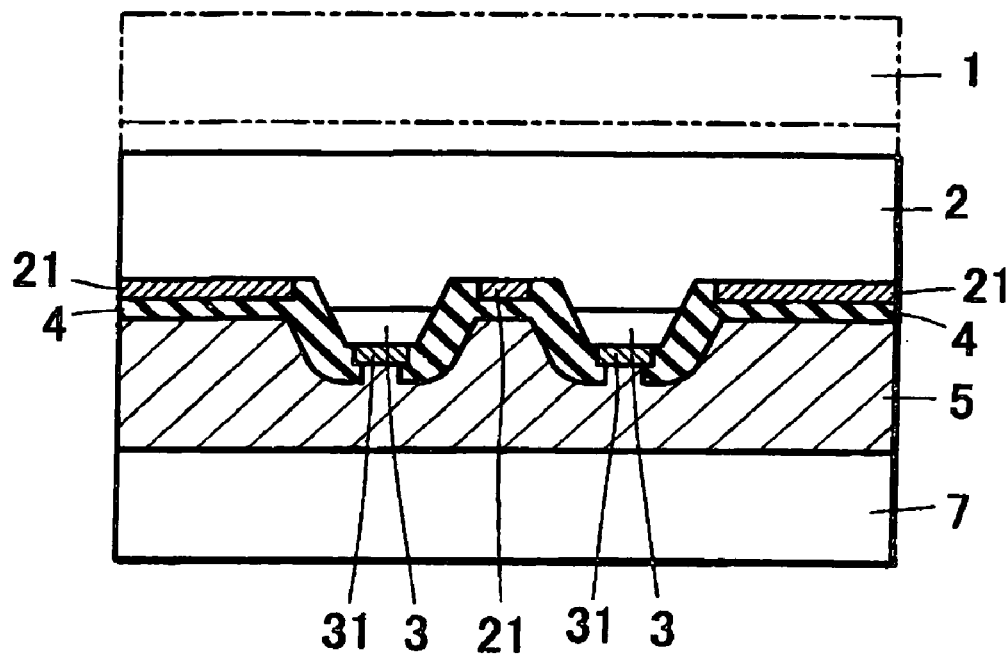
Figure 2:
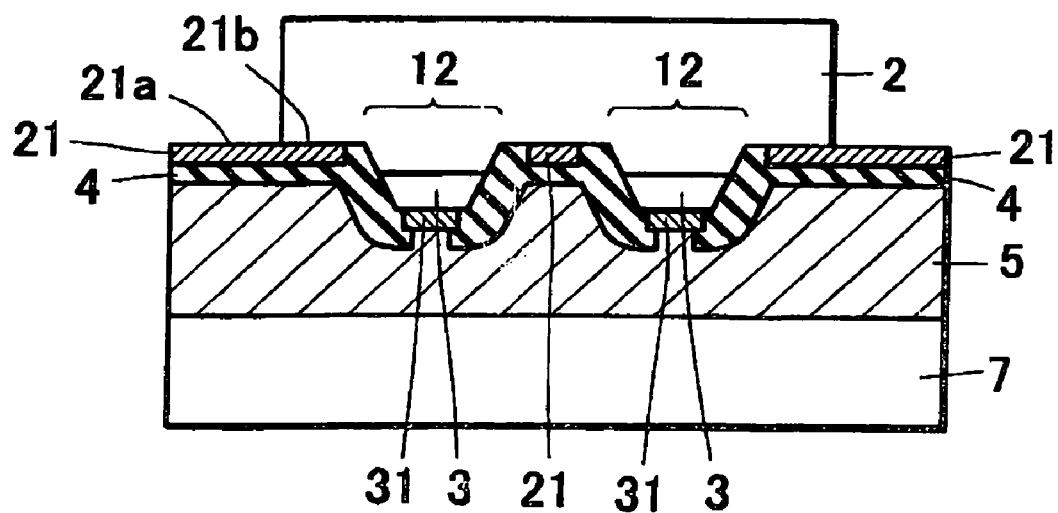

Electrodes formed on the device structure described above may be constituted, for example, by partially etching the semiconductor stacking structure shown in FIG. 2A so as to expose a part of the n-type layer 2 (first conductivity type layer) as shown in FIG. 2B, and forming first and second electrodes 21, 31 from Rh and Ti—Al on the p-type layer 3 (second conductivity type layer) and the n-type layer 2 (second conductivity type layer); respectively. After forming the electrodes and before exposing the semiconductor growing substrate, an insulating film that isolates the positive and negative electrodes from each other, a bonding layer 5a that acts as a bonding member for bonding to the support member, and a base layer 5' of the bonding layer 5a that connects the bonding layer 5a and the insulating film 4 and the electrode may be formed, and/or heat treatment may be applied to the electrodes that have been formed.

(Electrodes of Device Structure)

In the light emitting device of the present invention, the electrodes that are characteristic to the present invention that constitutes the device functions, in a part thereof, as a portion that makes ohmic contact on the electrode surface which makes contact with the semiconductor stacking structure, with other part thereof being led to the outside of the semiconductor stacking structure and is exposed for external connection. In the light emitting device of this embodiment, at least one of the electrodes connected to the semiconductor stacking structure has such a characteristic constitution as described above.

As described above, the electrodes characteristic to the present invention have a part of one of the principal surfaces (first principal surface) being semiconductor contact surfaces that make surface contact with the semiconductor stacking structure, with the rest of the one of the principal surfaces being external connection surface for connecting with the outside.

There has been such a structure that has external connection wiring provided with a wiring section formed on the support member side, mounting side when bonding onto the support member and mounting the components on the mounting surface, with a method that utilizes via holes drilled from the bottom of the semiconductor stacking structure to one conductivity type of the layers so as to form the electrodes. In any of these constitutions, one of the opposing surfaces of the electrode is used as the surface connected to the semiconductor and the other surface is used as the electrode surface for connecting to an external circuit.

In case one of the opposing electrode surfaces is used as the electrode surface for connection with the device (contact surface with the semiconductor layer) and the other surface is used a surface for external connection, constraint related to manufacture (manufacturing process, restriction of the order thereof) and constraint related to the design of device structure become problems. According to the present invention, however, since at least one of the electrodes provided in the semiconductor stacking structure has the semiconductor contact section provided so as to make direct contact with the device and the external connection section exposed to the outside that are formed on the same side, higher degree of freedom in the design is provided so that electrodes having high reliability, for example high bonding property with the device structure, electric characteristic and high adhesibility with the external interconnection can be easily obtained.

In the light emitting device of the present invention, while one (first electrode) of the electrodes provided in the semiconductor stacking structure has the electrode structure described above, the other electrode may have either such a constitution that has the semiconductor contact section and the external connection section on the same side similarly to the first electrode, or such a constitution as one of the opposing electrode surfaces is used as the semiconductor contact section and the other surface is used as the external connection section. This depends on the degree of freedom in the design of the device structure, and may be selected according to which mounting method and electrode arrangement are required for the light emitting device as a whole.

For example, as shown in the example described hereinafter, the semiconductor stacking structure is such that has the light emitting layer between the first and second conductivity type layers having the first electrode on the layer of one conductivity type and the second electrode on the layer of the other conductivity type. However, the semiconductor stacking structure may have either such a structure that includes a plurality of light emitting structure sections as shown in FIGS. 1 through 3, 5, 6 and 11B, or such a structure that is constituted from a single light emitting structure section that has the first and second electrodes. The light emitting structure section refers to a portion that has a structure which emits light in the light emitting device structure, and specifically such a structure that has a p-n junction surface, light emitting section or an active layer and the junction of the first and second electrodes. For example, it is such a structure that has at least the active layer or the interface between the layers of first and second conductivity types and the layer 3 of the second conductivity type as shown in the figures and the examples.

The light emitting structure section is formed, for example in the semiconductor stacking structure comprising the layer of first conductivity type, the light emitting layer and the layer of the second conductivity type, by etching until the layer of first conductivity type is exposed, and separating the light emitting layer and the layer of the second conductivity type in the form of islands or stripes. When the light emitting structure sections are separated in this way, it is necessary to connect the second electrodes provided on the separate light emitting structure sections with each other.

Figure 7:
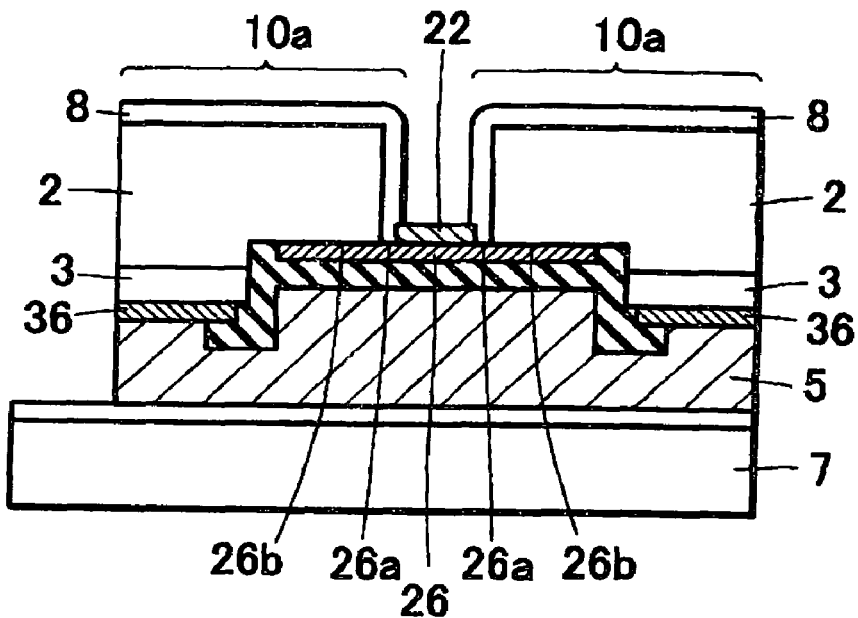
FIG. 7 is a schematic sectional view of a light emitting device according to a variation 4 of the present invention.

The light emitting device of the present invention may have a plurality of semiconductor stacking structures as shown in FIG. 7, or may have a plurality of electrodes provided separately on the layers of different conductivity types, in addition to the light emitting structure section and the device structure. It is because of the electrode structure characteristic of the present invention described above that various device structures, light emitting structures and electrode structures can be realized in this way.

(Structure of Light Emitting Device)

The structure of light emitting device may be such that since at least one of the electrodes provided in the semiconductor stacking structure has the semiconductor contact section and the external connection section that are formed on the same side as described above, and specific constitution thereof will be described below with reference to the accompanying drawings. The following description deals with an example in which the semiconductor stacking structure has p-type and n-type layers each having electrode formed thereon.

FIG. 1 is a schematic sectional view of a light emitting device according to one embodiment of the present invention. Provided in the section are two light emitting structure sections 12 that are isolated from each other, and the second electrode 31 is formed on the p-type layer 3 of each light emitting structure section 12. The second electrodes 31 of the different light emitting structure sections 12 are electrically connected with each other by the bonding member 5 that is electrically conductive and is provided in contact with the support member 7. The first electrode 21, on the other hand, is such that the electrode provided outside of the light emitting structure section 12 is the electrode that has the semiconductor contact section 21b and the external connection section 21a on the same side as described above. The first electrode 21 and the second electrode 31 are insulated from each other by the insulating film 4 on the semiconductor stacking structure. The first electrode 21 that is depicted in the drawing as if it were separated from the other first electrodes in the light emitting structure section is actually connected to the first electrode 21 disposed on the outer side of the interconnection (not shown) provided on the semiconductor stacking structure.

The second electrodes 31 are separated from each other by the sectional plane and are separated from each other on the semiconductor stacking structure. Alternatively, the second electrodes 31 may also be a continuous electrode connected with each other on the semiconductor stacking structure. In this embodiment, as described above, the bonding member 5 is made of an electrically conductive material and the support member 7 is made of an electrically conductive substrate, thereby to bring one of the principal surfaces of the second electrode 31 into contact with the p-type layer 3 so as to make it possible to make external connection from the other principal surface side of the second electrode 31. In other words, one of the principal surfaces of the second electrode 31 is the surface for making contact with the semiconductor, and the other principal surface of the second electrode 31 functions as the surface for external connection. With the support member 7 to be bonded made of an electrically conductive material, it is made possible to electrically connect the support member 7 to the second electrode 31, thereby to bring the back side opposite to the surface on the semiconductor stacking structure side into external connection of the second electrode, so that connection with an external circuit can be made via the electrode provided on the back surface of the support member 7. This makes it possible to make such an electrode structure that has an electrode connected to the second electrode on the back surface of the support member 7 and the external connection section 21a of the first electrode 21 on the semiconductor stacking structure side. In case the support member is made of an insulating material, the electrodes can be lead out from the back surface of the support member also by connecting the electrode of the support member formed on the semiconductor stacking structure side and the electrode formed on the opposite back surface by means of interconnect electrode.

Figure 3:
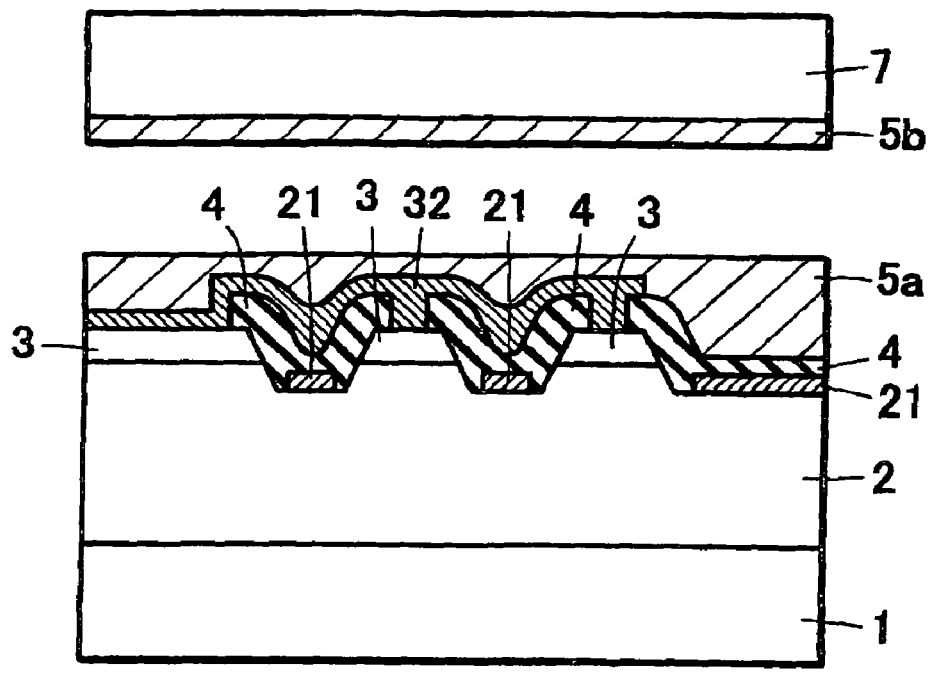
FIG. 3A is a schematic sectional view (1) explanatory of the process of manufacturing the light emitting device according to another embodiment of the present invention.
FIG. 3B is a schematic sectional view (2) explanatory of the process of manufacturing the light emitting device according to anther embodiment.
FIG. 3C is a schematic sectional view (3) explanatory of the process of manufacturing the light emitting device according to another embodiment.
Figure 3:
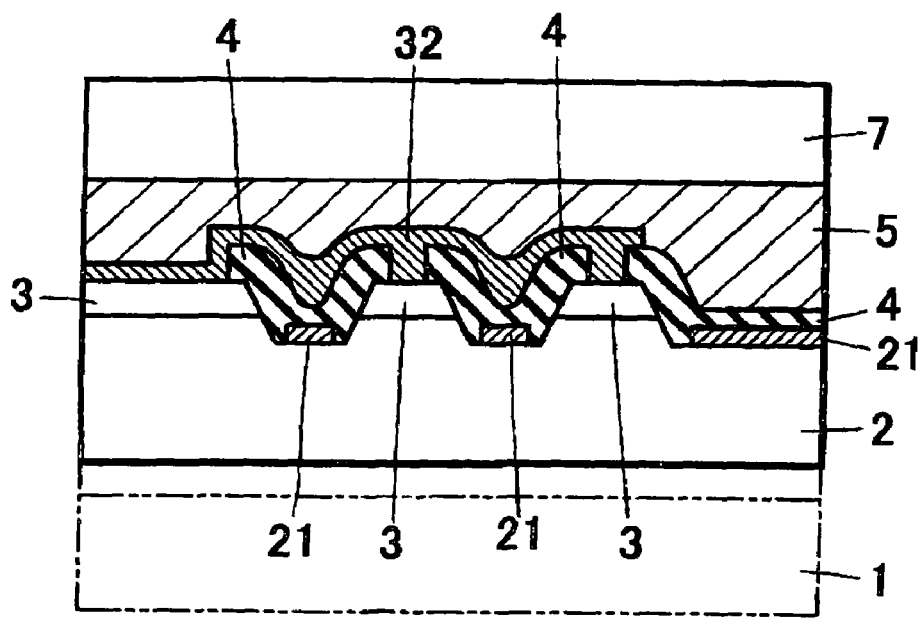
Figure 3:
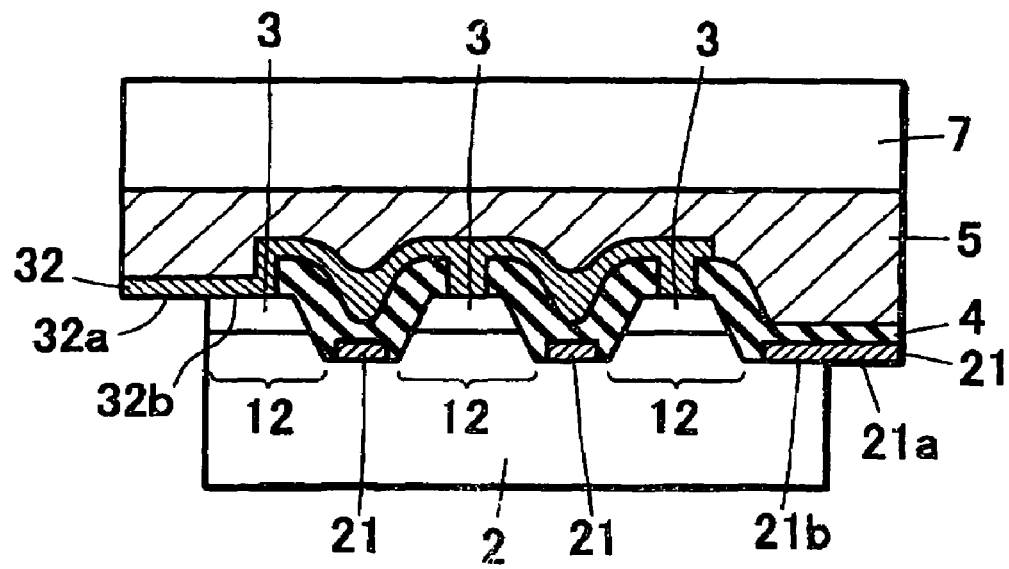

The light emitting device shown in FIG. 3C has a plurality of light emitting structure sections 12, while the plurality of light emitting structure sections 12 are connected with each other by means of a common second electrode 32. The second electrode 32 overlaps with the first electrode 21 via the insulating film 4. In the light emitting device shown in FIG. 3C, a part of the electrode surface of the second electrode 32, which makes contact with the p-type layer 3, is exposed by removing a part of the semiconductor stacking structure, and the exposed portion is used as the external connection section 32a of the second electrode. In the light emitting device shown in FIG. 3C, one of the first electrodes 21 is exposed, on a part of one principal surface that makes contact with the n-type layer 2 of the first electrode 21, by removing a part of the semiconductor stacking structure, and the exposed portion is used as the external connection section 21a of the first electrode, similarly to the light emitting device shown in FIG. 1. In the light emitting device shown in FIG. 3C, in this way, both the first electrode 21 and the second electrode 32 have the semiconductor contact section and the external connection section on the same side, so that the support member 7 can employ an insulating substrate since it is not used for external connection as in the case of the light emitting device shown in FIG. 1. That is, the electrode structure has both of the first electrode 21 and the second electrode 32 on the same side, one of which being a common electrode that connects the separated light emitting structure sections with each other, and the other electrode being the interconnection-like electrode connected with each other on the semiconductor stacking structure. Similarly to those shown in FIGS. 1 and 2, the light emitting structure sections may be either separated within a surface or formed in such a configuration as connected with each other and branched. While each of the light emitting devices shown in FIGS. 3, 5 and 9 has the second electrode 32, 34 on the second semiconductor layer of the light emitting structure section, it is preferable to provide ohmic electrodes on the second semiconductor layer 3 of each light emitting structure section and further provide interconnect electrode that connects the electrodes of the light emitting structure sections with each other, for example, interconnect electrode for providing the external connection section, for the reason of ohmic property and the accuracy of forming the electrodes.

Figure 4:
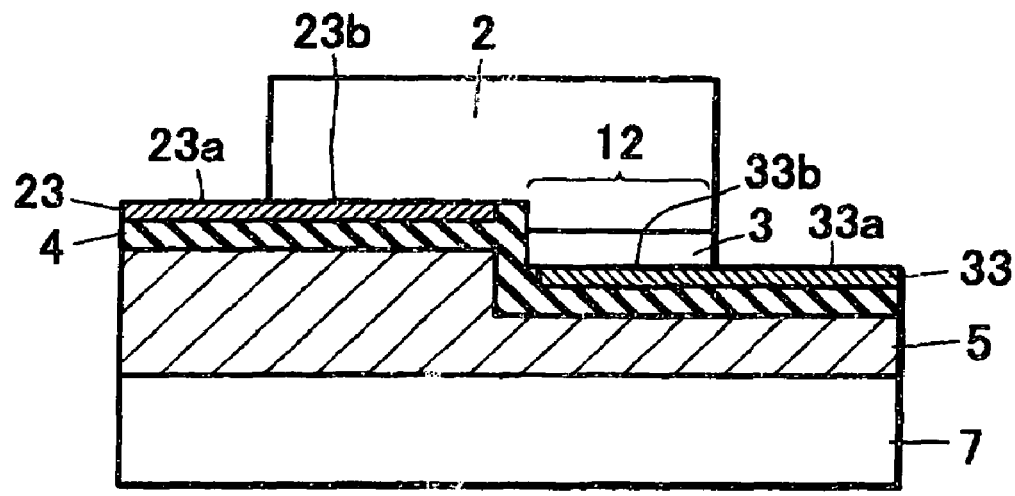
FIG. 4 is a schematic sectional view of a light emitting device according to a variation 1 of the present invention.

The light emitting device shown in FIG. 4 has the first electrode and the second electrode on the electrode forming side of the semiconductor stacking structure similarly to that shown in FIG. 3C, and both the first electrode and the second electrode have the semiconductor contact section and the external connection section provided on one of the principal surfaces, so that external connection can be made on the semiconductor stacking structure side. What is different from FIG. 3C is that, since the number of the light emitting structure section 12 is one and therefore the first electrode 23 and the second electrode 33 do not overlap with each other and are each one, the insulating film 4 is provided between the semiconductor stacking structure and the support member 7 so as to make a structure insulated with each other, thus resulting in higher reliability. In the constitutions shown in FIGS. 3C and 4, while the bonding member 5 to the support member 7 does not have electrical continuity with the support member 7 and may be an insulating material, although it is preferably a metallic member such as an alloy that has high thermal conductivity in consideration of heat dissipation from the light emitting device.

Figure 5:
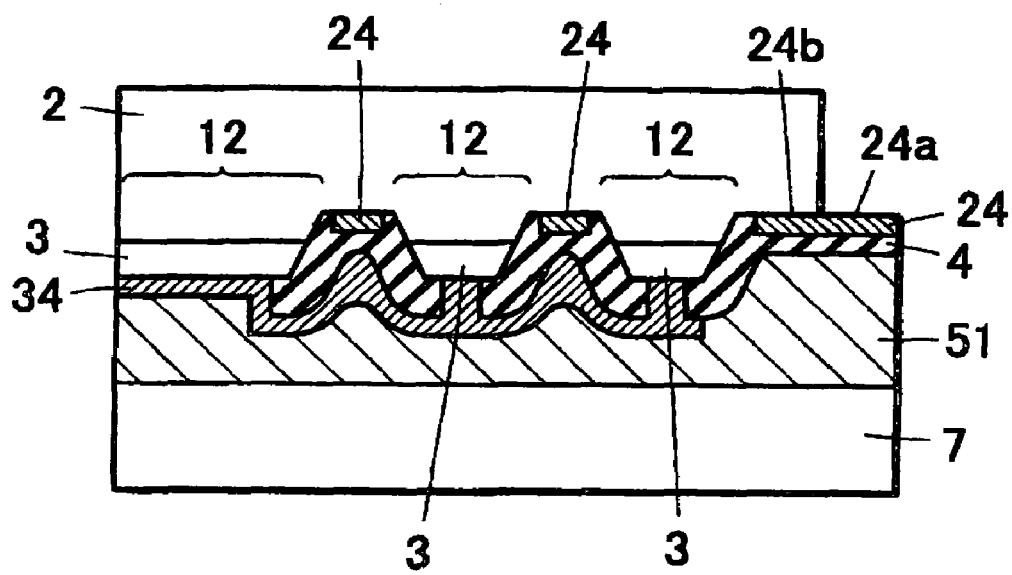
FIG. 5 is a schematic sectional view of a light emitting device according to a variation 2 of the present invention.

The light emitting device shown in FIG. 5 is different from the light emitting device shown in FIG. 3 in that the electrically conductive bonding member is used as a bonding member 51 similarly to the light emitting device shown in FIG. 1, while one of the principal surfaces of the second electrode 34 is used as the surface that makes contact with the p-type layer 3 and the other principal surface of the second electrode 34 is used as the surface to make external connection. Similarly to the light emitting device shown in FIG. 1, an electrically conductive substrate is used as the support member 7 so that, for example, connection with an external circuit is made on the bottom surface of the support member 7.

The light emitting device shown in FIG. 5 has a plurality of light emitting structure sections 12 similarly to the light emitting device shown in FIG. 3C, while the plurality of light emitting structure sections 12 are connected to each other by means of the common second electrode 34. The common electrode has an advantage over the light emitting device shown in FIG. 1 with regard to manufacturing, but has drawbacks that it overlaps the first electrode similarly to the case of FIG. 3C and each light emitting structure section does not have an electrode provided individually thereto, thus resulting in lower reliability.

Figure 6:
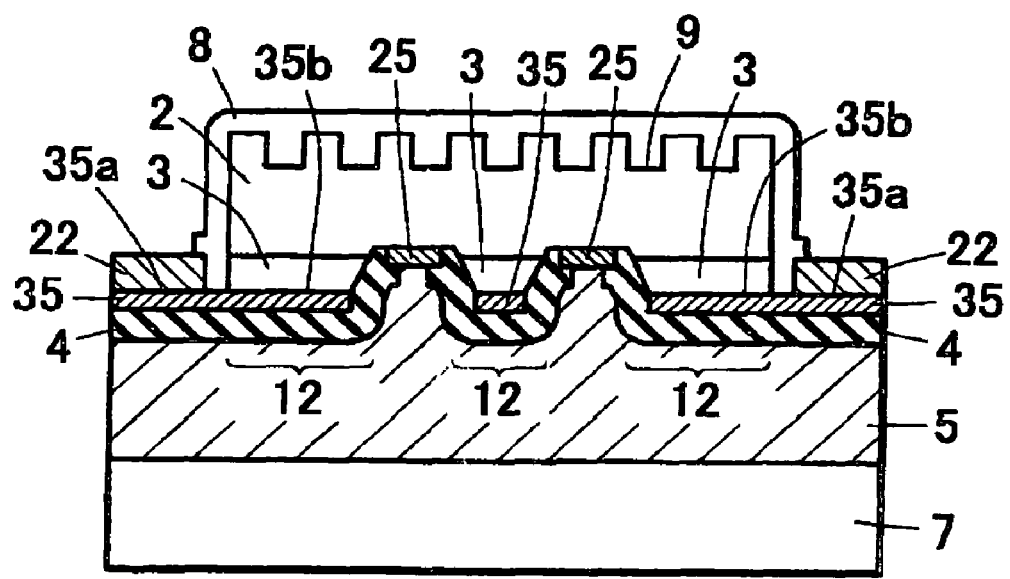
FIG. 6 is a schematic sectional view of a light emitting device according to a variation 3 of the present invention.

The light emitting device shown in FIG. 6 is different from the light emitting device shown in FIG. 1 in that structures of the first and second electrodes are inversed. Specifically, since the second electrodes 35 become wiring-like electrodes that are connected with each other on the semiconductor stacking structure, the light emitting structure sections 12 can be formed in such a structure as connected with each other. The first electrode 25, on the other hand, has such a structure as connected with each other by electrically conductive bonding member. In case only one conductive type of the electrodes has the semiconductor contact section and the external connection section provided on the same surface, the electrode may be either the first electrode (n electrode) or the second electrode (p electrode).

In the light emitting device shown in FIG. 7, two semiconductor stacking structure sections 10a that are separated from each other are connected by the first electrode 26 of common electrode that provides semiconductor contact section to both of these sections, in such a structure as the external connection section is provided on the same side of the first electrode 26. Specifically, one of the principal surfaces of the first electrodes 26 is exposed by removing a part of the semiconductor stacking structure 10, and is used as the external connection section 26a. Both sides of the external connection section 26a on one of the principal surfaces of the first electrodes 26 make contact with the n-type layers of the two semiconductor stacking structures sections 10a that are separated from each other. In the light emitting device shown in FIG. 7, in this way, the first electrode 26a has the semiconductor contact section 26b and the external connection section 26a provided on the same side thereof.

In the light emitting device shown in FIG. 7, on the other hand, an electrically conductive bonding member is used as the bonding member and an electrically conductive substrate as the support member 7, thereby to bring one of the principal surfaces of the second electrode 36 into contact with the p-type layer 3 so that external connection can be made on the other principal surface of the second electrode 36. In other words, one of the principal surfaces of the second electrode 36 is used as the surface to make contact with the semiconductor and the other principal surface of the second electrode 36 functions as the surface for external connection.

The two semiconductor stacking structures are a plurality of semiconductor stacking structures that are separated from each other. The light emitting device of the present invention allows it to provide a plurality of semiconductor stacking structures in a single light emitting device as in this example. By providing a plurality of stacked structures that are separated from each other as described above, it is made possible to suppress the absorption loss due to propagation of light within each stacked structure 10 make a light emitting structure section having high efficiency of extracting light to the outside.

(Electrode)

For the material to form the first and second electrodes 21, 31, particularly the electrodes for p-type nitride semiconductor, a metal or alloy, stacked structure, which include at least one kind selected from among a group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag) and yttrium (Y), or a compound thereof such as conductive oxide or nitride, including an electrically conductive metal oxide (oxide semiconductor), indium oxide doped with tin (Indium Tin Oxide; ITO) having thickness of 5 nm to 10 μm, ZnO, $In_2O_3$, $SnO_2$ or the same doped with a group III element of nitride semiconductor such as Ga, which can be preferably used as a translucent electrode. In the case of an oxide semiconductor material, an intermediate function between the layers 2, 3 of respective conductivity types and the electrodes 21, 31 thereof is performed, while the layers 2, 3 and the metal oxide may have the same conductivity type. In case oxide semiconductor layers of different conductivity types are used as the electrodes, an interposed layer (opposite conductivity type layer, oxide semiconductor, metal layer) may be provided between the semiconductor stacking structure 10. Alternatively, such a semiconductor layer and electrode material may be used as a diffusive conductor on the first conductivity type layer 2 side, because of the function as a diffusive conductor. In case the electrode 21 is made of a metal layer, it may be formed from a thin film that ensures light transmission in order to be transmissive. In order to form a reflective electrode, a metal having high reflectivity may be used such as Al, Ag or Rh.

The first electrode may be formed from a Ti layer (first layer) for ohmic contact with the first conductivity type layer and bonding with the nitride semiconductor, and an Al layer (second layer) for bonding with the insulating film 4 and the bonding member 5 preferably gold, Al or a metal of platinum group, such as Ti/Al. Such a structure is also employed as a layer made of a metal having a high melting point (W, Mo, platinum group) is provided as a barrier layer between the first layer for ohmic contact (for example, W, Mo or Ti is preferable for ohmic contact with the first conductivity type layer) and the second layer provided for bonding or pad, for example, W/Pt/Al, Ti/Rh (barrier layer 1)/Pt (barrier layer 2)/Al, Ti/Al/Ti/Pt (barrier layer)/Al is used particularly for the first electrode (for ohmic contact). For the ohmic electrode 23 of the second conductivity type layer 3, in addition to the two-layer structures of Ni/Au and Co/Au which are stacked in order from p-type layer, one that uses an electrically conductive oxide such as ITO, metal such as platinum group element or stacked structure or alloy thereof, for example two-layer structures of Rh/Ir, Pt/Pd is preferably used.

In the light emitting device structure of the present invention, in case the electrode forming surface in the semiconductor stacking structure, the surface that opposes the support member is used as the light extracting surface as shown in FIG. 6, satisfactory extraction of light can be achieved and the external quantum efficiency can be increased by forming irregular surface section 9 in the semiconductor stacking structure and the processing a patterned indented surface. Such an irregular surface section 9 may be formed on the end face, side face, exposed surface or interface of the semiconductor stacking structure 10 that is used as the light extracting surface of the light emitting device, interface between different materials such as the surface of semiconductor layer, substrate surface, metal forming surface or film interface surface such as insulating film. Surface irregularity may also be formed on the reflecting surface side, for example on the support member side in order to contribute to the reflection. For example, concavity and convexity can be formed by processing a film on the surface of the transparent insulating film 8 shown in FIG. 6. The irregular surface section 6 may be the shapes of protrusion (top face) or recess (bottom face) of various shapes such as dots, lattice, honeycomb, branches, rectangle, polygon, circle, with cross section of rectangular, trapezoidal or conical shape in the plane. While the size may be determined as required, specifically it may be in a range from 1 to 10 μm, preferably from 2 to 5 μm in the spacing between the openings, protrusions or recesses, length of one side (of rectangle or polygon) or diameter (dot, circle).

(Support Member and Bonding Structure Thereof)

Figure 11:
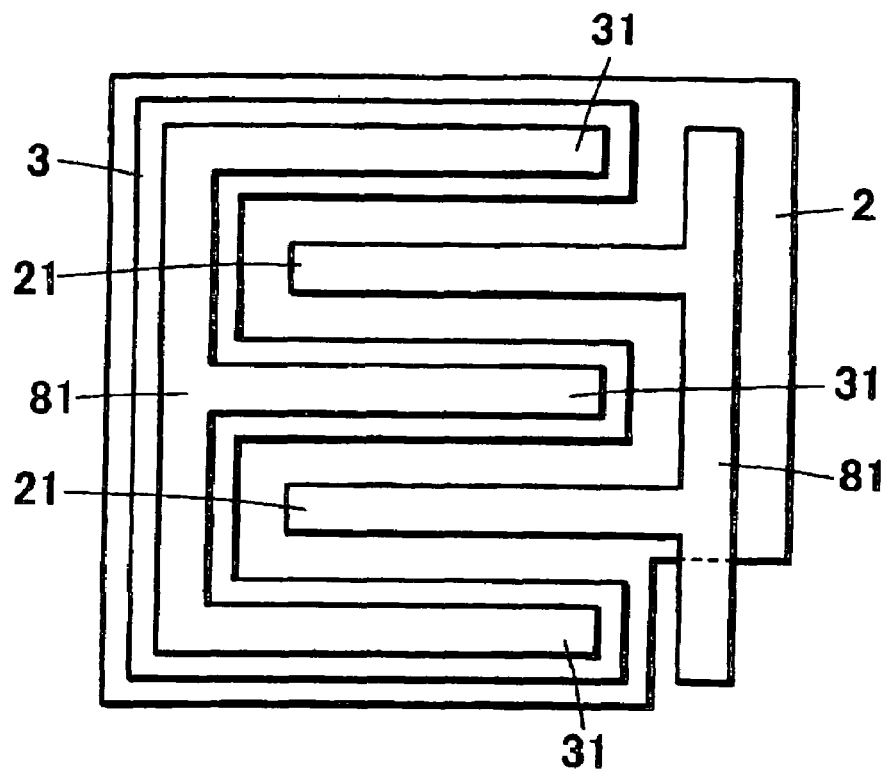
FIG. 11A is a schematic top view of the semiconductor stacking structure according to one embodiment of the present invention.
FIG. 11B is a schematic top view of the semiconductor stacking structure according to another embodiment of the present invention.
Figure 11:
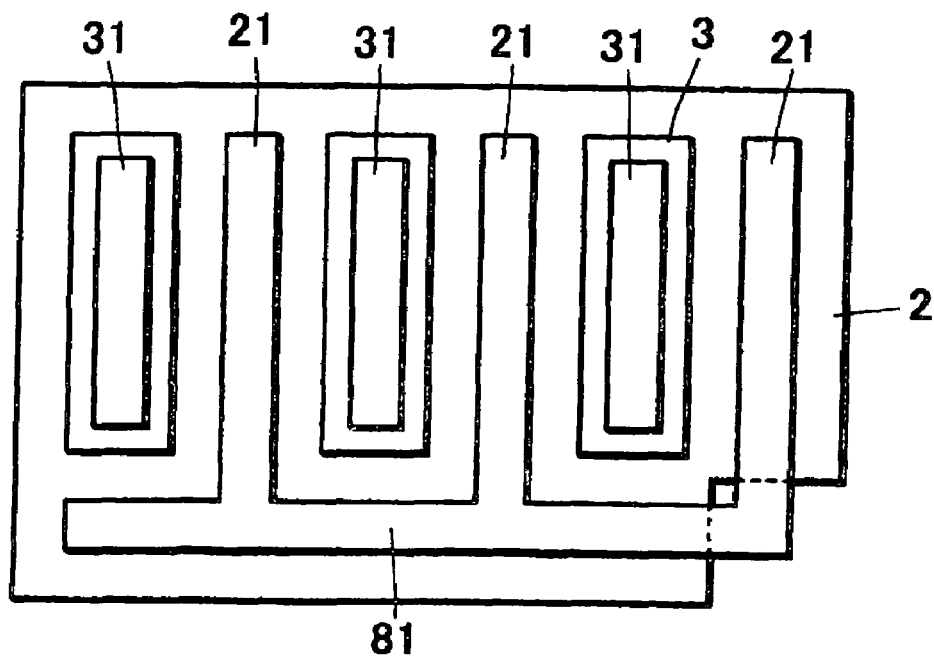

The structure that bonds the support member and the semiconductor stacking structure may be formed in various forms as shown in FIGS. 1 through 7. These forms of bonding can be roughly divided into ones that use the support member for the external connection of one of the electrodes, and ones that do not. In other words, there are structures where one of the electrodes of the semiconductor stacking structure and the support member 7 or the electrode formed on the support member are electrically connected by means of the electrically conductive bonding member, and structures where the support member and the semiconductor stacking structure are electrically isolated. The structures may also be classified further by the arrangement of the first and second electrodes within a plane of the semiconductor stacking structure and the arrangement of the insulating film that insulates between both electrodes and the structure of stacking these. That is, there are two kinds of those in which the electrodes are isolated within a plane of the semiconductor stacking structure (FIGS. 1, 2, 6, etc.) and those in which one electrode is placed over the other electrode via the insulating film (FIGS. 3, 5, etc.). Furthermore, the former is divided into those wherein the electrodes are continuously connected by wiring on the semiconductor stacking structure (FIG. 11A) and those wherein the electrodes are separated and connected with each other by the electrically conductive bonding member (FIG. 11B).

The semiconductor growing substrate whereon the semiconductor stacking structure 10 is grown may be, in the case of a nitride semiconductor device, an insulation material such as spinel (MgAl$_2$O$_4$) or sapphire that has principal surface in C plane, R plane or A plane, silicon carbide (6H, 4H, 3C), silicon, ZnS, ZnO, Si, GaAs, diamond, or an oxide that makes lattice bonding with the nitride semiconductor such as lithium niobate or neodymium gallate. A substrate made of a nitride semiconductor such as GaN or AlN may also be used provided that the thickness is large enough for device processing (several tens of micrometers or more). The substrate of different material may be prepared with an offset angle. In case that C plane of sapphire is used, the offset angle is in a range from 0.01 to 3.0°, preferably 0.05 to 0.5°.

Figure 10:
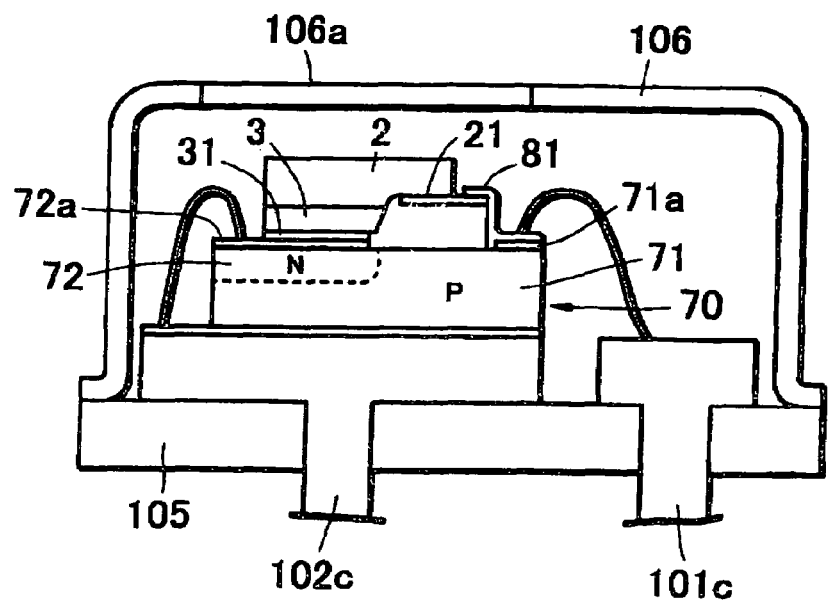
FIG. 10 is a schematic sectional view of a light emitting apparatus constituted integrally from the light emitting device according to the present invention and a zener diode.

The support member 7 may be formed from various materials in accordance to the purpose, such as a metallic material or a semiconductor material for an electrically conductive substrate to increase the heat dissipation, or an insulating substrate made of a ceramic material or sintered material. Specifically, a semiconductor substrate made of a semiconductor material such as Si, SiC, GaAs, GaP, InP, ZnSe, ZnS, ZnO, a substrate made of a single metal, a metallic substrate made of a composite of two or more metals that do not form a solid solution with each other or have a low limit of solid solution, in which case the metallic materials may be at least one kind of metal selected from among a group of high conductivity metals such as Ag, Cu, Au, Pt, etc., and at least one kind of metal selected from among a group of high hardness metals such as W, Mo, Cr, Ni, etc. In case the support member 7 made of a semiconductor material is used as shown in FIG. 10, device function such as zener diode may be added to the support member 7 of the semiconductor device. The metal substrate is preferably made of a composite material such as Cu—W or Cu—Mo. The material to make the support member 7 and the bonding method are selected by considering the absorption and loss of light from the light emitting device by the support member 7 and the adhesion with the semiconductor stacking structure 10. In case light is extracted from the support member 7 side, a light transmissive material is selected and such a structure is employed as the optical loss is minimized by means of a light transmissive bonding member 5 such as a resin or partial bonding method. In case light is extracted from the semiconductor stacking structure 10 side, on the other hand, the efficiency of extracting light to the outside may be improved by providing a reflecting film such as Al or Ag, or providing a reflective electrode on the bonding member 5 or the support member 7, the insulating film 4, or a part of the semiconductor stacking structure 10.

For the material and structure of the bonding member, in addition to a mixture such as Ag paste, carbon paste or ITO paste, a composite material (organic material), soldering material, metals such as Au, Sn, Pd, In or the like, stack or alloy thereof is preferably used for the reason of heat resistance in consideration of heat dissipation from the light emitting device 120, which is effective for the device of the present invention having a large area and generates a large amount of heat through operation with a large current. For the combination of eutectic forming layers, Au—Sn, Sn—Pd or In—Pd is preferably used. In addition, metal bump or metal-to-metal junction such as Au—Au junction may be used.

When the bonding member is formed and bonded onto the support member, it can be bonded without forming void between the semiconductor stacking structure and the support member in the bonding portion. This makes it possible to achieve efficient light emission from the semiconductor stacking structure without being lost in void between the semiconductor stacking structure and the support member. Also when an electrically conductive material is used for the bonding member, it is made possible to electrically connect a plurality of electrode segments that are separated on the semiconductor stacking structure, or electrically connect to the support member side via the bonding member. In case the electrode on the semiconductor stacking structure and the support member are electrically connected, it is made possible to form a wiring section for connecting the support member and the external circuit, and therefore excellent light emission characteristic can be ensured without being affected by the positional accuracy during bonding with the support member even when the positional accuracy is low, thereby improving the yield of production, advantageously.

In FIG. 11A, the first electrode 21 and the second electrode 31 are connected with each other by the interconnect electrode 81 on the semiconductor stacking structure. In FIG. 11B, the first electrode 21 is connected by the interconnect electrode 81 on the semiconductor stacking structure, and the second electrode 31 that is separated is connected with each other, for example, by the electrically conductive bonding member that is used when bonding with the support member.

(Light Emitting Apparatus)

Now an example of light emitting apparatus constituted from the light emitting device of the embodiment will be described.

Figure 8:
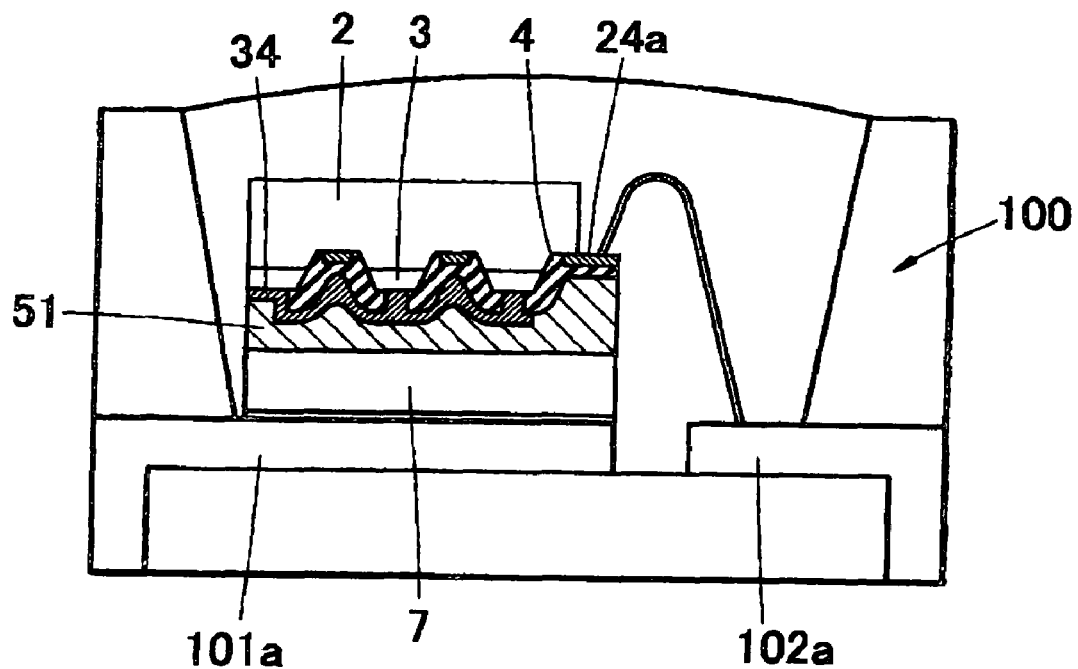
FIG. 8 is a schematic sectional view of a light emitting apparatus constituted from the light emitting device according to one embodiment of the present invention.

FIG. 8 shows an example of a light emitting apparatus constituted from the light emitting device shown in FIG. 5 mounted on a package 100.

The light emitting device shown in FIG. 5 has one (for example, p-side) of the support member electrodes for external connection formed on the mounting surface of the support member 7, while the support member electrode and one lead 101*a* are bonded by means of the electrically conductive bonding member 51 and electrically connected with each other. The first electrode 24 of n-side of the light emitting device is connected to another lead 102*a* by means of an electrically conductive wire in the external connection section 24*a*.

Figure 9:
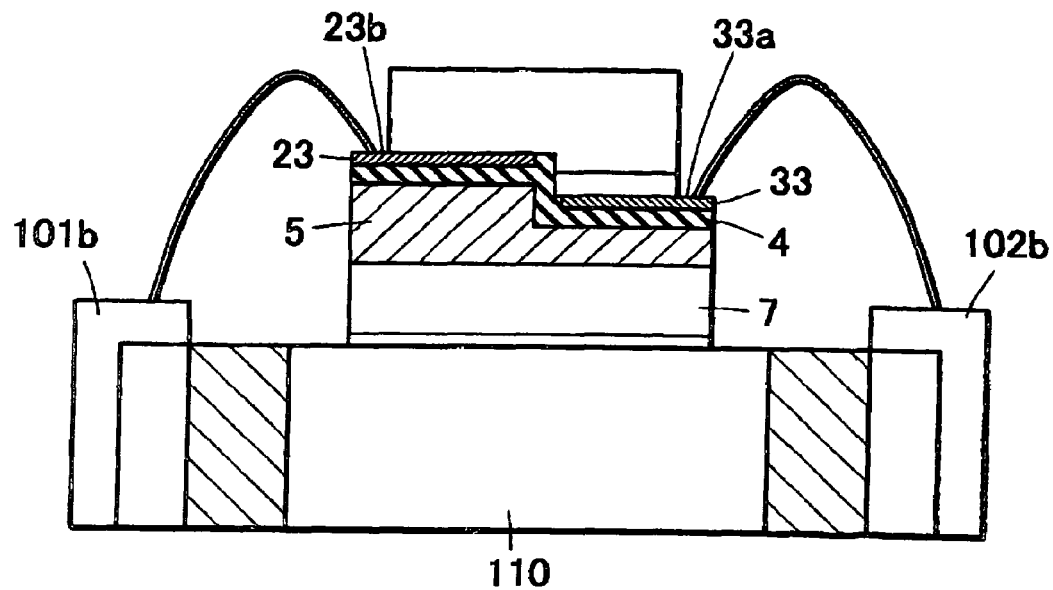
FIG. 9 is a schematic sectional view showing the state of mounting a light emitting device according to another embodiment of the present invention.

FIG. 9 shows an example of a light emitting apparatus constituted by using the light emitting device shown in FIG. 4. In this example, the external connection section 23*a* of the first electrode 23 and the external connection section 33*a* of the second electrode 33 are connected by electrically conductive wire to a lead 101*b* and a lead 102*b*, respectively. When the first electrode 23 and the second electrode 33 are both formed in the structure characteristic to the present invention, such a constitution can be employed as the support member side is mounted on the heat dissipation base and the electrodes of the semiconductor stacking structure are electrically connected to the lead 101*b* and the lead 102*b* by wiring members from the respective external connection sections.

In FIG. 9, reference numeral 110 denotes, for example, a heat sink made of a metal.

In another example, as shown in FIG. 10, a protective circuit is formed by using the support member as a protective device of the light emitting device, for example a zener diode, mounted in a package thereby to constitute the light emitting apparatus. Specifically, a zener diode is connected as a protective device in reverse parallel to a light emitting diode of the semiconductor stacking structure, the external connection section 21*a* of the first electrode 21 and a positive electrode 71*a* of the zener diode are connected with the interconnect electrode 81, and further connected to a lead frame 101*c* with an electrically conductive wire. The second electrode 31 is connected to a negative electrode 72*a* of the zener diode and is further connected to a lead frame 102*c* with an electrically conductive wire.

In the example shown in FIG. 10, the package is constituted from a stem 105 that has the lead frame 101*c* and the lead frame 102*c* and a cap 106 that seals the light emitting device, where the cap 106 has a window 106*a*.

(Method for Manufacturing a Light Emitting Device)

The method for manufacturing the light emitting device will now be described by way of Examples 1 through 3.

Figure 12:
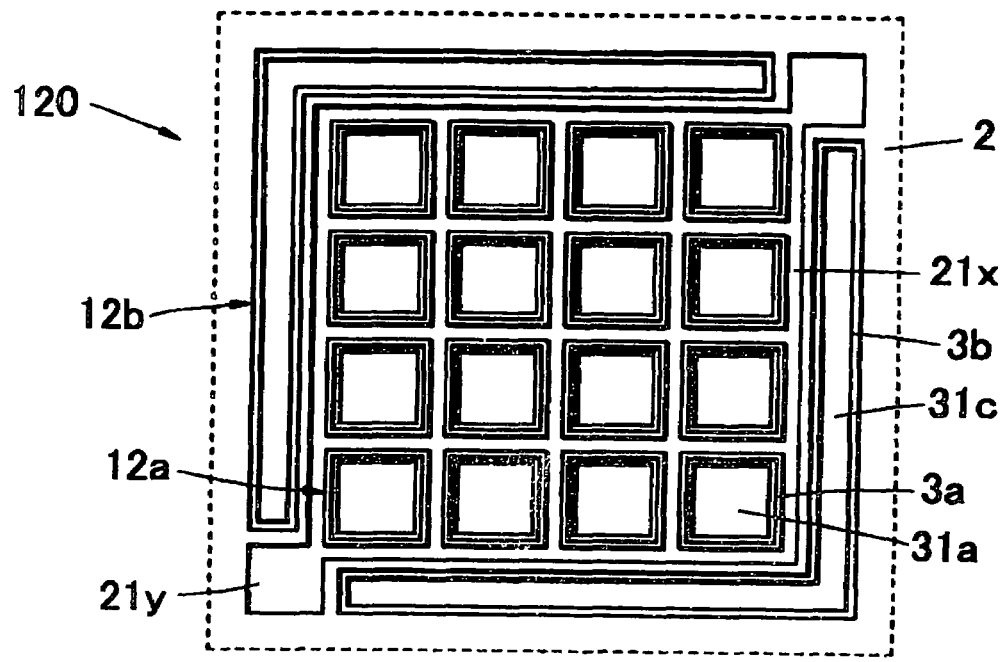
FIG. 12A is a plan view of the electrode forming surface side according to Example 1 of the present invention.
FIG. 12B is a plan view of the light emitting device obtained in Example 1.
FIG. 12C is a sectional view along line A-A of FIG. 12A.
Figure 12:
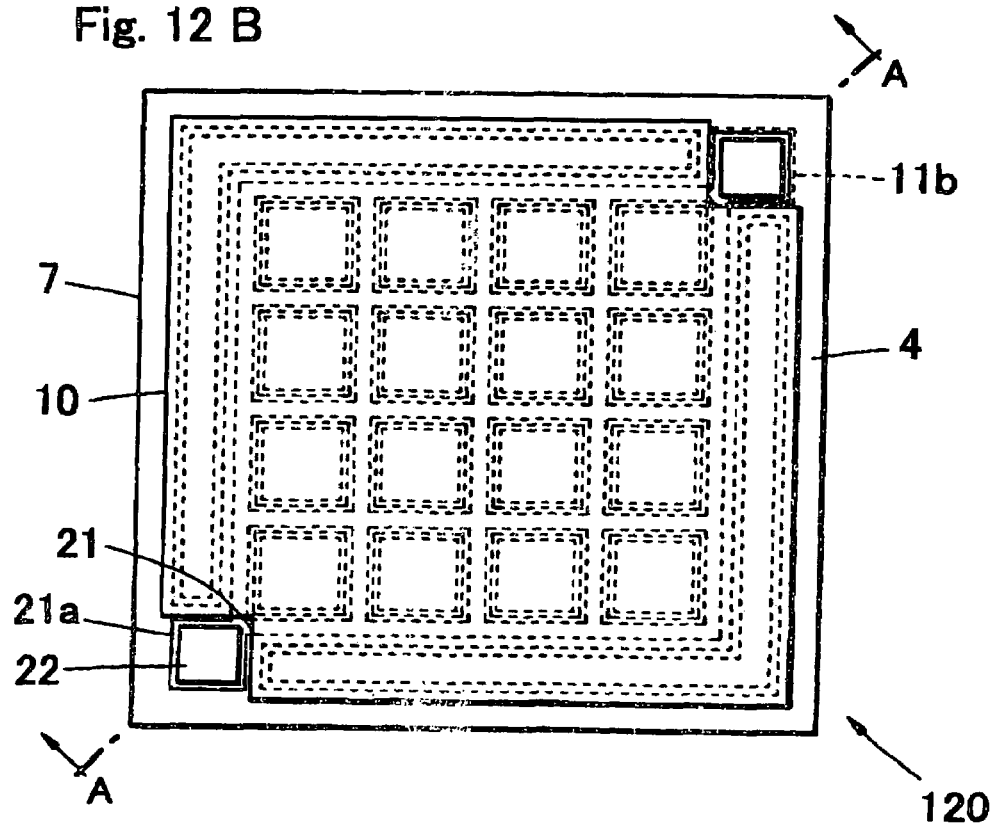
Figure 12:
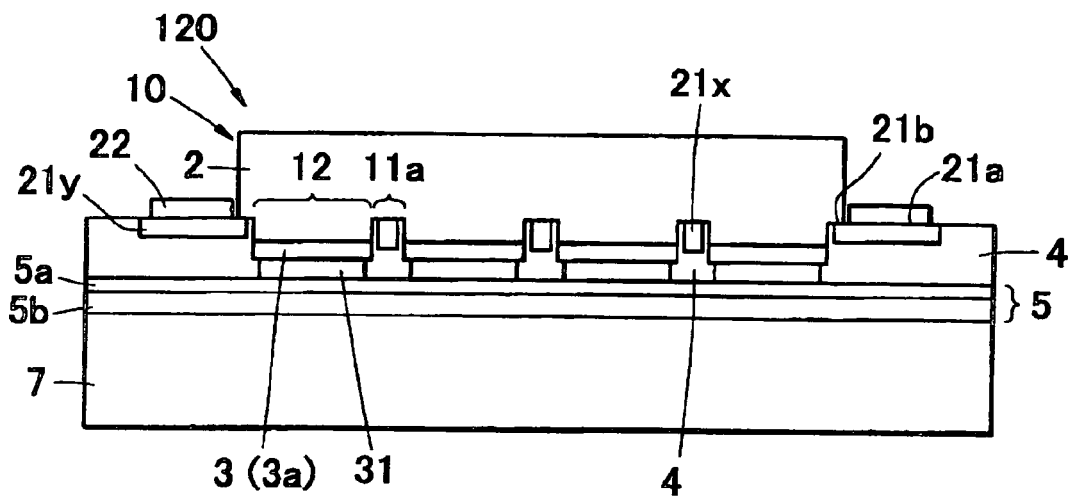
Figure 13:
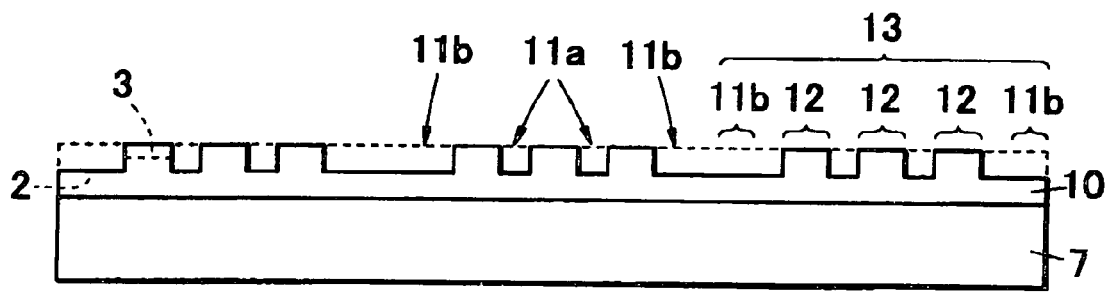
FIG. 13A is a sectional view of the semiconductor stacking structure constituted from n-type and p-type nitride semiconductor layers formed on a semiconductor growing substrate, after forming an electrode forming section in the process of manufacturing the light emitting device of Example 1.
FIG. 13B is a sectional view after forming a first electrode (n electrode) and a second electrode (p electrode) in the process of manufacturing the light emitting device of Example 1.
FIG. 13C is a sectional view after forming an insulating film 4 on the semiconductor stacking structure and exposing a part of the second electrode 31 in the process of manufacturing the light emitting device of Example 1.
FIG. 13D is a sectional view after forming a junction layer and a bonding member 5b on the support member side in the process of manufacturing the light emitting device of Example 1.
FIG. 13E is a sectional view before dividing into individual light emitting devices in the process of manufacturing the light emitting device of Example 1.
Figure 13:
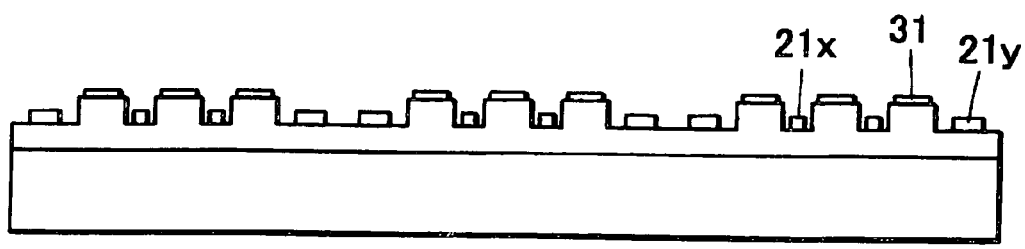
Figure 13:
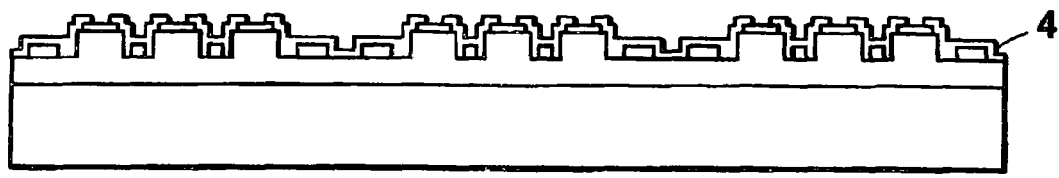
Figure 13:
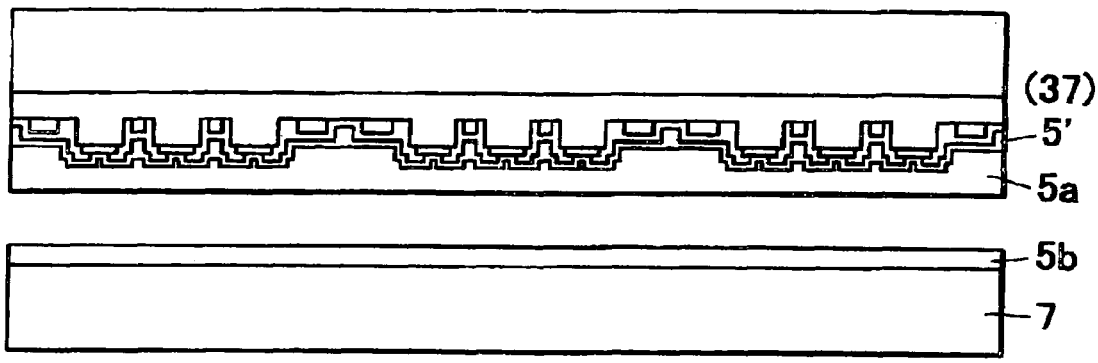
Figure 13:
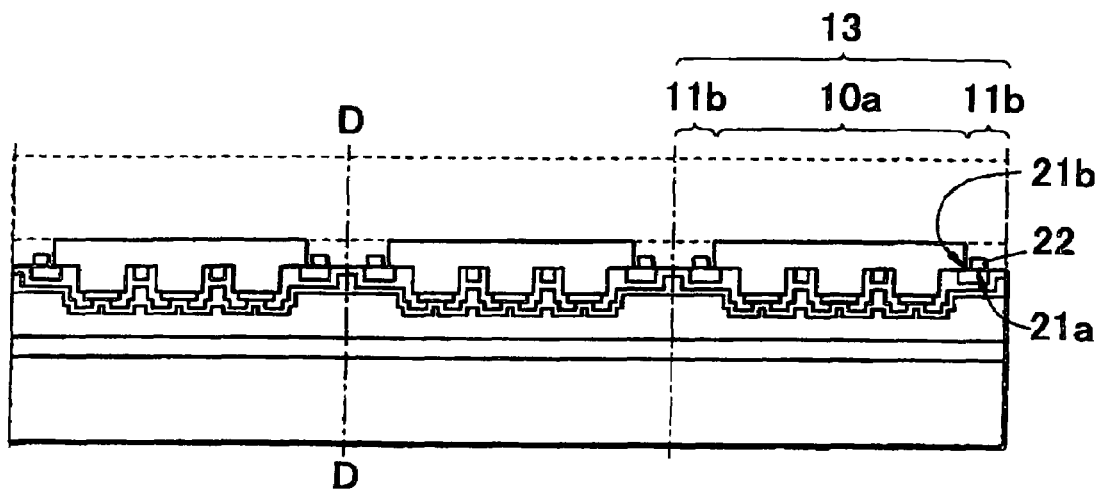

Example 1 shows by way of FIG. 13 the method for manufacturing the light emitting device shown in FIG. 12. Example 2 takes FIG. 2 and Example 3 takes FIG. 3 to show the method for manufacturing the light emitting device.

Example 1

In Example 1, the semiconductor stacking structure 10 is constituted by forming n-type layer and p-type layer from nitride semiconductor on the semiconductor growing substrate 1, and forming the electrode forming section 11 (the exposed portion of the surface of the n-type layer 2) for forming the first electrode (n electrode) (FIG. 13A). The semiconductor stacking structure described above is employed for the specific stacked structure. As shown in FIG. 13A, a plurality of device structure sections 13 are provided on the semiconductor stacking structure 10 formed on the semiconductor growing substrate 1, while the first electrode forming section 11 and the adjacent light emitting structure section 12 are provided on the device structure section 13. The electrode forming section 11 has a forming section 11*a* interposed by the light emitting structure section 12 and, as can be seen in FIG. 12, an outside exposure section 11*b* where electrodes 21*x* are connected and external connection electrodes 21*y* are provided extending to the periphery of the device structure section 13. Then the first electrode (n electrode) 21 having the structure of stacking in the order of Ti—Al—Ti—Pt—Al and the second electrode (p electrode) 31 having the structure of stacking Rh—Ir—Pt are formed on the electrode forming section 11 and the light emitting structure section 12, respectively (FIG. 13B). After forming the electrodes, annealing treatment is applied at a temperature of 600° C.

Then as shown in FIG. 13C, $SiO_2$ is formed as the insulating film 4 via the electrodes 21, 31 on the semiconductor stacking structure 10, and a part of the second electrode 31 that is electrically connected to the support member is exposed. Further as shown in FIG. 13D, a junction layer constituted by stacking Ti—Pt—Au serving as a base layer for the bonding member on the insulating film 4 and also as a pad electrode 37 for the electrical connection to the second electrode 31 is formed on the light emitting structure section 12 (the second electrode 31) and on the electrode forming section 11 (the insulating film 4, the first electrode 21) as a layer 5' that covers substantially the entire surface of the device structure section 13, and a member constituted by stacking Sn—Au is formed as a bonding member 5*a* that covers substantially the entire surface of the device structure section 13 on the junction layer. A junction layer consisting of Ti—Pt—Au for the base layer and a bonding member 5*b* provided thereon consisting of Sn—Au are also formed on the support member 7 (Cu—W is used in this case).

Then as shown in FIG. 13E, after bonding the bonding members 5 (5*a* and 5*b*) on the device side and the support member side by thermocompressive bonding, the semiconductor growing substrate 1 is removed by irradiating laser beam on the substrate side, and further the underlying layer that is a part of the semiconductor stacking structure 10 and a part of the n-type layer are removed by polishing or the like, thereby to expose the n-type layer. Then the semiconductor stacking structure 10 of the outside exposure section 11*b* is removed by etching and a part of the forming surface side of the first electrode 21 is exposed while leaving the semiconductor contact section 21*b* to remain, and the external connection section 21*a* provided on the exposure section 11*b* that protrudes toward the outside is formed on the semiconductor stacking structure 10*a* and the structure sections 10*a* that are separated from each other on the support member. A pad electrode is provided on the electrode section 21*a* and a transparent protective film (not shown) is formed so as to cover substantially the entire surface of the semiconductor stacking structure 10. A pad electrode consisting of Ti/Pt/Au stacked in order is formed on the external connection section 21*a*. Last, the device structure sections 13 are separated by dicing (along line DD in FIG. 13E), thereby to obtain light emitting devices 120.

The light emitting device 101 obtained as described above has a structure shown in FIG. 12, which will now be described in detail. FIG. 12A is a plan view of the semiconductor stacking structure after forming the electrodes 21, 31 viewed from the electrode forming surface side. It can be seen that the first conductivity type layer (n-type layer) is exposed, the first electrode (n electrode) 21 is provided, and the second electrode 31a is provided on the second conductivity type layer (p-type layer) 3 in the plurality of island-shaped light emitting structure sections 12a that are separated from each other being surrounded by the linear electrode 21x. The device also has the light emitting structure section 12b along the periphery that surrounds the region wherein the plurality of light emitting structure sections 12a are disposed, and a second electrode (p electrode) 31c on the second conductivity type layer (p-type layer) 3b of the light emitting structure section 12b. The device also has the first electrode section 21y as the outside exposure section 11b that electrically connects to the outside on the first electrode 21x of lattice configuration. FIG. 12B is a plan view of the light emitting device that is obtained as described above, and FIG. 12C is a sectional view along line AA thereof. As will be seen from the drawings, the first electrode 21 provided on the semiconductor stacking structure 10 has the contact section 21b and the external connection section 21a, and the pad electrode 22 is provided on the external connection section 21a.

The light emitting device of Example 1 described above has an optical output of 74.64 mW, about 7% higher than the optical output of 69.59 mW in comparative example 1.

Example 2

In Example 2, first the n-type layer 2 and the p-type layer 3 made of nitride semiconductor are grown on the semiconductor growing substrate 1 (FIG. 2A). Before growing the n-type layer 2 and the p-type layer 3, an underlying layer is grown but is not shown. Specifically, the stacked structure is constituted from the underlying layer (the low-temperature buffer layer, the first underlying layer, the second underlying layer), the n-type layer (the first n-type layer, the second n-type layer), the active layer and the p-type layer (the first through third p-type layers) laminated respectively on a sapphire substrate similarly to the semiconductor stacking structure shown above.

Then etching operation is carried out so as to expose the electrode forming surface (surface of the n-type layer 2) for the formation of the first electrode (n electrode) and separate into a plurality of light emitting structure sections 12, thereby to form the first electrode 21 on the electrode forming surface of the n-type layer 2, and form the second electrode 31 on the p-type layer 3 of the light emitting structure section 12 (FIG. 2B).

Then the insulating film 4 that isolates between the first electrode 21 and the second electrode 31 (FIG. 2C), and the bonding member 5a for bonding with the support member 7 is formed thereon so as to cover the electrode and the insulating film of the semiconductor stacking structure (FIG. 2D). Specifically, the first and second electrodes may have a structure of stacking Ti—Al—Ti—Pt—Al successively on the surface of n-type layer that has been exposed as the first electrode 21, and the structure of stacking Rh—Ir—Pt successively on the surface of the p-type layer as the second electrode 31. After forming the electrodes, heat treatment may be applied to the electrodes before bonding onto the support member, for example, annealing treatment at a temperature of 600° C. in the case of this electrode structure. For the insulating film 4, $SiO_2$ is formed. A junction layers (not shown) constituted by stacking Ti—Pt—Au are formed on the bonding side of the stacking structure and on the bonding side the support member 7 respectively. Each junction layer is formed as a base layer for the bonding member. The junction layer on the stacking structure also serves as a pad electrode of the second electrode. A member which is formed by stacking the bonding member 5a consisting of Sn—Au on the junction layer may be used as a bonding member.

The support member 7 that has the bonding member 5b provided on one surface thereof is prepared and, with the bonding member 5b and the bonding member 5a disposed to oppose each other, the support member 7 and the stacked structure of the semiconductor growing substrate 1 are bonded by thermocompression bonding so as to interpose the semiconductor stacking structure wherein the first electrode 21 and the second electrode 31 are formed (FIG. 2E). The support member may be made of Cu—W. In this bonding process, the bonding member 5 may be formed and bonded only on either one of the support member 7 or the semiconductor stacking structure.

After bonding, the semiconductor growing substrate 1 and the underlying layer are removed (FIG. 2F). The substrate 1 may be removed by irradiating the substrate with laser beam (KrF excimer laser having wavelength of 248 nm) so as to decompose the semiconductor located near the interface between the substrate and the semiconductor by laser ablation, thereby to separate the substrate. The underlying layer may be removed by polishing or the like after removing the substrate.

Then the semiconductor stacking structure outside of the light emitting device structure is removed in order to expose the surface of the first electrode 21 that becomes the external connection section 21a on the same surface with the semiconductor contact section of the first electrode 21 (FIG. 2G).

In Example 2, a protective film is formed on the surface of the semiconductor stacking structure and a pad electrode is formed on the external connection section 21a, although not shown in the drawing.

Also in Example 2, a process may be provided for processing the device to add an optical function that improves the efficiency of extracting light on the light extracting side of the semiconductor stacking structure as shown in FIG. 6.

Also after the process of forming the electrodes described above, processes may also be provided for heat treatment of the electrodes and heat treatment of the device structure, so as to improve the characteristics of the electrodes and the device.

The light emitting device shown in FIG. 1 can be thus manufactured.

Example 3

In Example 3, a light emitting device that has the first electrode and the second electrode having the external connection section formed on the same surface with the semiconductor contact section is manufactured.

In Example 3, the n-type layer 2 and the p-type layer 3 are grown on the semiconductor growing substrate 1, etching operation is carried out so as to expose the electrode forming surface for the formation of the first electrode and separate into a plurality of light emitting structure sections 12, thereby to form the first electrode 21 on the electrode forming surface of the n-type layer 2, and form the second electrode 32 on the p-type layer 3 of the light emitting structure section 12 (FIG. 3A). In Example 3, the second electrode 32 is used as the common electrode for the plurality of light emitting structure sections, as shown in FIG. 3A.

Then the bonding member 5a for bonding with the support member 7 is applied between the first electrode 21 and the second electrode 31, and bonded onto the support member 7 that has the bonding member 5b applied onto one of the surfaces thereof (FIG. 3A).

After bonding, the semiconductor growing substrate 1 and the underlying layer are removed (FIG. 3B).

In this case, an insulating substrate is used as the support member and an insulating member is used as the bonding member in the bonding operation.

Then the semiconductor stacking structure outside of the light emitting device structure is removed in order to expose the surface of the first electrode 21 that becomes the external connection section 21a on the same surface with the semiconductor contact section 21b of the first electrode 21, and expose the surface of the second electrode 32 that becomes the external connection section 32a on the same surface with the semiconductor contact section 32b of the second electrode 32 (FIG. 3C).

Thus the light emitting device of the present invention can be manufactured, wherein the first electrode 22 has the semiconductor contact section 21b and the external connection section 21a on the same surface and the second electrode 32 also has a similar electrode structure.

Comparative Example 1

Manufacturing process is similar to that of Example 1, except for the following points. Before bonding onto the support member, only the second electrode (p electrode) is formed without forming the electrode forming section where the n-type layer is exposed. The first electrode (n electrode) is formed on the exposed n-type layer after bonding onto the support member and removing the semiconductor growing substrate and the underlying layer and a part of the n-type layer. In this process, removal of the semiconductor stacking structure for providing the external connection section in Example 1 is not carried out, and the pad electrode is not formed. That is, the light emitting device of comparative example 1 has such a structure as neither the first electrode nor the second electrode have the external connection section, and the first and second electrodes are disposed opposing each other to interpose the semiconductor stacking structure.

Since the first electrode is formed on the light extracting side in comparative example 1, optical output tends to be lower than that in Example 1 because light is shaded by the electrode and is absorbed by the electrode material. Also because the first electrode is formed after bonding, it is necessary to give consideration to the heat resistance of the bonding member during the heat treatment, and sufficient heat treatment cannot be carried out. As a result, it is difficult to obtain the light emitting device having the first electrode of sufficient characteristics (heat resistance, bonding property, etc.).

INDUSTRIAL APPLICABILITY

The present invention is applicable mainly to the structure of electrodes provided in a semiconductor stacking structure formed by stacking semiconductor layers, and the device structure can be used, in addition to the light emitting device, LED and LD, in a light emitting apparatus wherein the light emitting device is mounted on a substrate or a package, a light emitting apparatus that utilizes a light conversion member such as phosphor material that converts a part of light from the light emitting device.

What is claimed is:

1. A semiconductor light emitting device comprising:
   a semiconductor stacking structure having a first semiconductor layer and a second semiconductor layer of conductivity types different from each other,
   a first electrode connected to the first semiconductor layer, and
   a second electrode connected to the second semiconductor layer,
   wherein one principal surface of said first electrode has (1) a portion that makes direct contact with a surface of the first semiconductor layer so as to establish electrical continuity and (2) another portion that is exposed and forms an external connection section,
   wherein said semiconductor stacking structure is formed on or above a support member,
   wherein said first electrode and said second electrode are provided between said support member and said semiconductor stacking structure, and
   wherein a bonding member fills all of a space between confronting surfaces of said support member and said semiconductor stacking structure.

2. The semiconductor light emitting device according to claim 1, wherein said second electrode has (1) a portion that makes contact with the second semiconductor layer so as to establish electrical continuity and (2) another portion that is exposed and forms an external connection section, the two portions of said second electrode being provided on one principal surface of said second electrode.

3. The semiconductor light emitting device according to claim 1, wherein
   one principal surface of the second electrode has a portion that makes contact with the second semiconductor layer so as to establish electrical continuity; and
   another principal surface of the second electrode is an external connection section.

4. The semiconductor light emitting device according to claim 1, wherein
   said support member is an electrically conductive substrate,
   said bonding member is an electrically conductive member, and wherein
   one of said first electrode and said second electrode is bonded with the electrically conductive member so as to establish electrical continuity.

5. The semiconductor light emitting device according to claim 4, wherein said second electrode makes electrical contact with said electrically conductive substrate by said electrically conductive bonding member to form an outer electrode on said electrically conductive substrate side.

6. The semiconductor light emitting device according to claim 4, wherein the first and second electrodes are insulated by an insulating film on the semiconductor stacking structure.

7. The semiconductor light emitting device according to claim 4, further comprising a third electrode on a surface of said support member to be connected with an external circuit.

8. The semiconductor light emitting device according to claim 1, wherein said external connection section of the first electrode has a pad electrode.

9. The semiconductor light emitting device according to claim 8, wherein said external connection section is disposed on an outer side of said semiconductor stacking structure.

10. The semiconductor light emitting device according to claim 1, wherein the bonding member is electrically conductive, and another principal surface of the said first electrode is covered with an insulating film.

11. A semiconductor light emitting device comprising:
a semiconductor stacking structure having a first semiconductor layer and a second semiconductor layer of conductivity types different from each other,
a first electrode connected to the first semiconductor layer, and a second electrode connected to the second semiconductor layer, wherein
one principal surface of said first electrode has (1) a portion that makes direct contact with a surface of the first semiconductor layer so as to establish electrical continuity and (2) another portion that is exposed and forms an external connection section, and wherein
one of said first electrode and said second electrode is electrically separated into a plurality of electrode segments on or above said semiconductor stacking structure,
wherein said semiconductor stacking structure is formed on or above a support member,
wherein said first electrode and said second electrode are provided between said support member and said semiconductor stacking structure, and
wherein a bonding member fills all of a space between confronting surfaces of said support member and said semiconductor stacking structure.

12. The semiconductor light emitting device according to claim 11, wherein
said bonding member is an electrically conductive bonding member,
said second electrode is composed of said electrode segments being connected to each other by the electrically conductive bonding member, and wherein
said first electrode surrounds said electrode segments.

13. The semiconductor light emitting device according to claim 12, wherein said external connection section is composed of at least a pair of sections opposed to each other so as to sandwich said surrounded electrode segments, said pair of sections being disposed outer sides of semiconductor stacking structure.

14. The semiconductor light emitting device according to claim 13, wherein said electrode segments are surrounded by a linear first electrode formed in lattice configuration.

15. The semiconductor light emitting device according to claim 13, wherein said support member is an electrically conductive substrate, and further comprising a third electrode on a surface of said support member to be connected with an external circuit.

* * * * *